United States Patent
Roh et al.

(10) Patent No.: US 11,908,931 B2
(45) Date of Patent: Feb. 20, 2024

(54) MONOLITHIC METAL-INSULATOR TRANSITION DEVICE AND METHOD FOR MANUFACTURING THE SAME

(71) Applicant: ELECTRONICS AND TELECOMMUNICATIONS RESEARCH INSTITUTE, Daejeon (KR)

(72) Inventors: Tae Moon Roh, Daejeon (KR); Hyun-Tak Kim, Daejeon (KR); Sun Ae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 70 days.

(21) Appl. No.: 17/499,736

(22) Filed: Oct. 12, 2021

(65) Prior Publication Data

US 2022/0115535 A1    Apr. 14, 2022

(30) Foreign Application Priority Data

Oct. 12, 2020  (KR) .................. 10-2020-0131370
Oct. 8, 2021   (KR) .................. 10-2021-0133941

(51) Int. Cl.
  *H01L 29/78*      (2006.01)
  *H10N 99/00*      (2023.01)

(52) U.S. Cl.
  CPC ......... *H01L 29/7817* (2013.01); *H10N 99/03* (2023.02)

(58) Field of Classification Search
  CPC .................. H01L 29/7817; H01L 27/0623
  See application file for complete search history.

(56) References Cited

U.S. PATENT DOCUMENTS 8,536,554 B2   9/2013 Kim et al.
9,281,812 B2   3/2016 Kim
9,397,090 B1*  7/2016 Chen ............... H01L 27/027
                       (Continued)

FOREIGN PATENT DOCUMENTS

CN   101689605 A    3/2010
CN   104283535 B   10/2018
                (Continued)

OTHER PUBLICATIONS

Hyun-tak Kim, "Negative-differential-resistance-switching Si-transistor operated by power pulse and identity of Zener breakdown", Applied Physics Letters 103, 173501 (Oct. 21, 2013).

*Primary Examiner* — Raj R Gupta
(74) *Attorney, Agent, or Firm* — Rabin & Berdo, P.C.

(57) ABSTRACT

Provided is a monolithic metal-insulator transition device. The monolithic metal-insulator transition device includes a substrate including a driving region and a switching region, first and second source/drain regions on the driving region, a gate electrode between the first and second source/drain regions, an inlet well region formed adjacent to an upper surface of the substrate on the switching region, a control well region having a different conductivity type from the inlet well region between the inlet well region and a lower surface of the substrate, a first wiring electrically connecting the first source/drain region and the control well region, and a second wiring electrically connecting the second source/drain region and the inlet well region.

3 Claims, 26 Drawing Sheets

(56) References Cited

U.S. PATENT DOCUMENTS

| | | | |
|---|---|---|---|
| 9,595,673 B2 | 3/2017 | Kim et al. | |
| 2009/0245543 A1* | 10/2009 | Onodera | H03F 3/1855 |
| | | | 381/174 |
| 2010/0301300 A1 | 12/2010 | Kim et al. | |
| 2011/0018607 A1 | 1/2011 | Kim et al. | |
| 2019/0035823 A1* | 1/2019 | Hekmatshoartabari | |
| | | | H01L 27/1285 |

FOREIGN PATENT DOCUMENTS

| | | |
|---|---|---|
| DE | 102014109241 A1 | 1/2015 |
| EP | 2147471 B1 | 3/2012 |
| JP | 2009239202 A | 10/2009 |
| JP | 5838244 B2 | 1/2016 |
| KR | 100701159 B1 | 3/2007 |
| KR | 100859717 B1 | 9/2008 |
| KR | 1020090059823 A | 6/2009 |
| KR | 20150005416 A | 1/2015 |
| KR | 101796146 B1 | 11/2017 |
| KR | 101834904 B1 | 3/2018 |
| WO | 2009027826 A2 | 3/2009 |
| WO | 2017215157 A1 | 12/2017 |

* cited by examiner

MONOLITHIC METAL-INSULATOR TRANSITION DEVICE AND METHOD FOR MANUFACTURING THE SAME

CROSS-REFERENCE TO RELATED APPLICATIONS

This U.S. non-provisional patent application claims priority under 35 U.S.C. § 119 of Korean Patent Application Nos. 10-2020-0131370, filed on Oct. 12, 2020, and 10-2021-0133941, filed on Oct. 8, 2021, the entire contents of which are hereby incorporated by reference.

BACKGROUND

The present disclosure herein relates to a monolithic metal-insulator transition device including a critical current supply region (driving region) for metal-insulator transition induction.

Specifically, the present disclosure herein relates to the development of a monolithic metal-insulator transition device composed of a combination of two types of transistors integrated on a single substrate, and belongs to the semiconductor device design and manufacturing field.

A metal-insulator transition device is a switching device using state transition of a material, and may be used as a power semiconductor device. The power semiconductor device is a device which performs power control processing in an electronic device. The power semiconductor device is essential for a power module and a power system. The power module may include, for example, a DC-DC converter, a power inverter, a power supply, and the like. The power semiconductor device should have a high breakdown voltage when switched off, and a high allowable current when switched on. In addition, the power semiconductor device requires less heating when turned on. The on-resistance of the monolithic metal-insulator transition device may be reduced by using negative differential resistance (NDR) properties.

PRIOR ART DOCUMENT (Patent document 1) U.S. Pat. No. 9,281,812 B2 (MIT transistor system including critical current supply device)
(Non-patent document 1) Hyun-tak Kim, 'Negative-differential-resistance-switching Si-transistor operated by power pulse and identity of Zener breakdown', Applied Physics Letters 103, 173501 (2013)

SUMMARY

The present disclosure provides a monolithic metal-insulator transition device which has excellent electrical properties and is easy-to-manufacture.

An embodiment of the inventive concept provides a monolithic metal-insulator transition device including a switching region in which metal-insulator-transition switching occurs, and a driving region configured to supply a critical current to the switching region such that the metal-insulator-transition switching occurs, wherein the switching region and the driving region may be present in one silicon substrate.

In an embodiment, the monolithic metal-insulator transition device may include first and second source/drain regions on the driving region, a gate electrode between the first and second source/drain regions, an inlet well region formed adjacent to an upper surface of the substrate in the switching region and doped with an impurity of a first conductivity type, a control well region having a second conductivity type different from the first conductivity type between the inlet well region and a lower surface of the substrate, a first wiring electrically connecting the first source/drain region and the control well region, and a second wiring electrically connecting the second source/drain region and the inlet well region, wherein the silicon substrate may have the first conductivity type.

In an embodiment of the inventive concept, a monolithic metal-insulator transition device includes a substrate including a driving region and a switching region, first and second source/drain regions on the driving region, a gate electrode between the first and second source/drain regions, an inlet well region formed adjacent to an upper surface of the substrate on the switching region, a control well region having a different conductivity type from the inlet well region between the inlet well region and a lower surface of the substrate, a first wiring electrically connecting the first source/drain region and the control well region, and a second wiring electrically connecting the second source/drain region and the inlet well region.

In an embodiment, the monolithic metal-insulator transition device may further include an extension region surrounding the second source/drain region and extending below the gate electrode, wherein the extension region has a lower impurity concentration than the second source/drain region.

In an embodiment, the first source/drain region may include a first impurity region of a first conductivity type and a second impurity region of a second conductivity type different from the first conductivity type.

In an embodiment, the monolithic metal-insulator transition device may further include a first contact connecting the first wiring and the first source/drain region and a inlet contact connecting the second wiring and the inlet well region, wherein a lower end of the control contact may have a larger width than a lower end of the source/drain contact.

In an embodiment, the monolithic metal-insulator transition device may further include a inlet contact connecting the second wiring and the (inlet well region, wherein a lower end of the inlet contact may have a larger width than the gate electrode.

In an embodiment, the monolithic metal-insulator transition device may further include a channel well region surrounding the first and second source/drain regions on the driving region, wherein the channel well region may have a different conductivity type from the substrate.

In an embodiment, the second source/drain region may have the same conductivity type as the inlet well region.

In an embodiment, the monolithic metal-insulator transition device may further include a metal-insulator transition transistor on the switching region, wherein the metal-insulator transition transistor may operate in a negative differential resistance (NDR) mode.

In an embodiment, the monolithic metal-insulator transition device may further include a lower electrode electrically connected to the substrate on the lower surface of the substrate.

In an embodiment, the monolithic metal-insulator transition device may further include a plurality of control contact regions having a higher impurity concentration than the control well region in the control well region.

In an embodiment, the substrate may include a lower layer and, on the lower layer, an upper layer having a lower impurity concentration than the lower layer, and the control well region may be disposed in the upper layer, and may be connected to the lower layer.

In an embodiment of the inventive concept, a monolithic metal-insulator transition device includes a lower electrode, a substrate having a first conductivity type on the lower electrode, wherein the substrate includes a driving region and a switching region, a control well region having a second conductivity type different from the first conductivity type on the switching region, an inlet well region having the first conductivity type in the control well region, a first source/drain region including a first impurity region having the first conductivity type and a second impurity region having the second conductivity type on the driving region, first and second source/drain regions having the first conductivity type on the driving region, and a gate electrode between the first source/drain region and the second source/drain region, wherein the first source/drain region is electrically connected to the control well region, and the second source/drain region is electrically connected to the inlet well region.

In an embodiment, the monolithic metal-insulator transition device may further include an extension region surrounding the second source/drain region and extending below the gate electrode, wherein the extension region may have the first conductivity type, and the extension region may have a lower impurity concentration than the second source/drain region.

In an embodiment, the monolithic metal-insulator transition device may further include a lower electrode electrically connected to the substrate on the lower surface of the substrate.

In an embodiment, the monolithic metal-insulator transition device may further include a channel well region surrounding the first and second source/drain regions on the driving region, wherein the channel well region may have the second conductivity type.

In an embodiment, the second source/drain region may have the first conductivity type.

In an embodiment, the monolithic metal-insulator transition device may further include a plurality of control contact regions having a higher impurity concentration than the control well region in the control well region.

In an embodiment, the substrate may include a lower layer and, on the lower layer, an upper layer having a lower impurity concentration than the lower layer, and the control well region may be disposed in the upper layer, and may be in contact with the lower layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
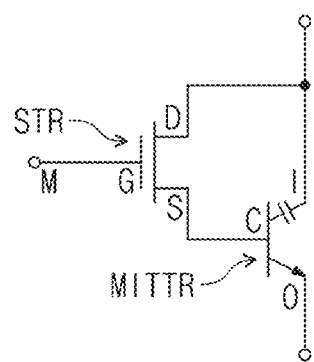
FIG. 1 and FIG. 2 are equivalent circuit diagrams of monolithic metal-insulator transition devices according to embodiments of the inventive concept.

In order to facilitate sufficient understanding of the configuration and effects of the present invention, preferred embodiments of the present invention will be described with reference to the accompanying drawings. However, the present invention is not limited to the embodiments set forth below, and may be embodied in various forms and modified in many alternate forms. Rather, these embodiments are provided so that this disclosure will be thorough and complete, and will fully convey the scope of the present invention to those skilled in the art to which the present invention pertains. Those skilled in the art will understand that the concepts of the present invention may be performed in any suitable environment.

The terms used herein are for the purpose of describing embodiments and are not intended to be limiting of the present invention. In the present disclosure, singular forms include plural forms unless the context clearly indicates otherwise. As used herein, the terms "comprises" and/or "comprising" are intended to be inclusive of the stated elements, steps, operations and/or devices, and do not exclude the possibility of the presence or the addition of one or more other elements, steps, operations, and/or devices.

In the present disclosure, when any film (or layer) is referred to as being on another film (or layer) or substrate, it means that the film may be directly formed on another film (or layer) or substrate, or that a third film (or layer) may be interposed therebetween.

Although the terms first, second, and the like are used in various embodiments of the present disclosure to describe various regions, films (or layers), and the like, these regions, films, and the like should not be limited by these terms. These terms are only used to distinguish any predetermined region or film (or layer) from another region or film (or layer). Thus, a film referred to as a first film in one embodiment may be referred to as a second film in another embodiment. Each embodiment described and exemplified herein also includes its complementary embodiment. Like reference numerals refer to like elements throughout the specification.

Unless otherwise defined, terms used in the embodiments of the inventive concept may be interpreted as meanings commonly known to those skilled in the art.

Figure 2:
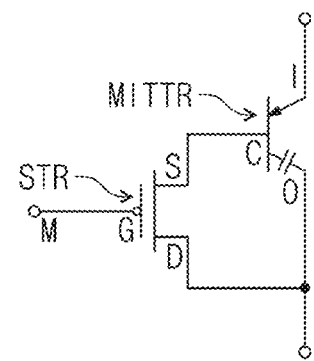

FIG. 1 and FIG. 2 are equivalent circuit diagrams of monolithic metal-insulator transition devices according to embodiments of the inventive concept.

Referring to FIG. 1 and FIG. 2, a power device according to embodiments of the present invention may include a metal-insulator transition transistor MITTR and an auxiliary transistor STR. The metal-insulator transition transistor MITTR may provide a switching operation using a change in the state of a material constituting the same. The change in the state of a material may include a phase transition of the material or change in the electrical state of the material. The metal-insulator transition transistor MITTR may be, for example, a T-switch of a three-terminal structure. The metal-insulator transition transistor MITTR may include an inlet terminal I, an outlet terminal O, and a control terminal C. The metal-insulator transition transistor MITTR may be provided with an electrical signal (e.g., power) through the inlet terminal I. The outlet terminal O may be an output terminal for outputting an electrical signal according to the control of the control terminal C. The metal-insulator transition transistor MITTR may receive a current through the control terminal C and generate a metal-insulator transition phenomenon between the control terminal C and the outlet terminal O. For example, the metal-insulator transition phenomenon may include a change in the state between an insulator or semiconductor material and a metal. Accordingly, an electrical signal applied to the inlet terminal I may be output to or be limited to the outlet terminal O.

Specifically, as a current (or voltage) applied to the control terminal C of the metal-insulator transition transistor MITTR increases, a current between the inlet terminal I and the outlet terminal O may discontinuously increase. The current between the inlet terminal I and the outlet terminal O may rapidly increase or decrease based on a specific current value applied to the control terminal C. At this time, the specific current value may be referred to as a critical current. According to embodiments, when the critical current is applied to the control terminal C, the voltage between the inlet terminal I and the outlet terminal O may decrease. This is referred to herein as a negative differential resistance (NDR) mode. That is, the metal-insulator transition transistor MITTR according to embodiments of the present invention may operate in a negative differential resistance mode.

The auxiliary transistor STR may include, for example, a field effect transistor. The auxiliary transistor STR may include a gate terminal G, a source terminal S, and a drain terminal D. The gate terminal G may be a manager terminal M of the monolithic metal-insulator transition device. The source terminal S and the drain terminal D of the auxiliary transistor STR may be connected to any one of the control terminal C and the outlet terminal O of the metal-insulator transition transistor MITTR according to embodiments. The auxiliary transistor STR may provide a critical current for generating a metal-insulator transition phenomenon between the control terminal C and the outlet terminal O to the metal-insulator transition transistor MITTR.

Referring to FIG. 1, the metal-insulator transition transistor MITTR and the auxiliary transistor STR may be n-type MOS transistor transistors. The drain terminal D of the auxiliary transistor STR may be connected to the inlet terminal I of the metal-insulator transition transistor MITTR. The source terminal S of the auxiliary transistor STR may be connected to the control terminal C of the metal-insulator transition transistor MITTR.

Referring to FIG. 2, the metal-insulator transition transistor MITTR and the auxiliary transistor STR may be p-type MOS transistor transistors. The drain terminal D of the auxiliary transistor STR may be connected to the outlet terminal O of the metal-insulator transition transistor MITTR. The source terminal S of the auxiliary transistor STR may be connected to the control terminal C of the metal-insulator transition transistor MITTR.

Figure 3:
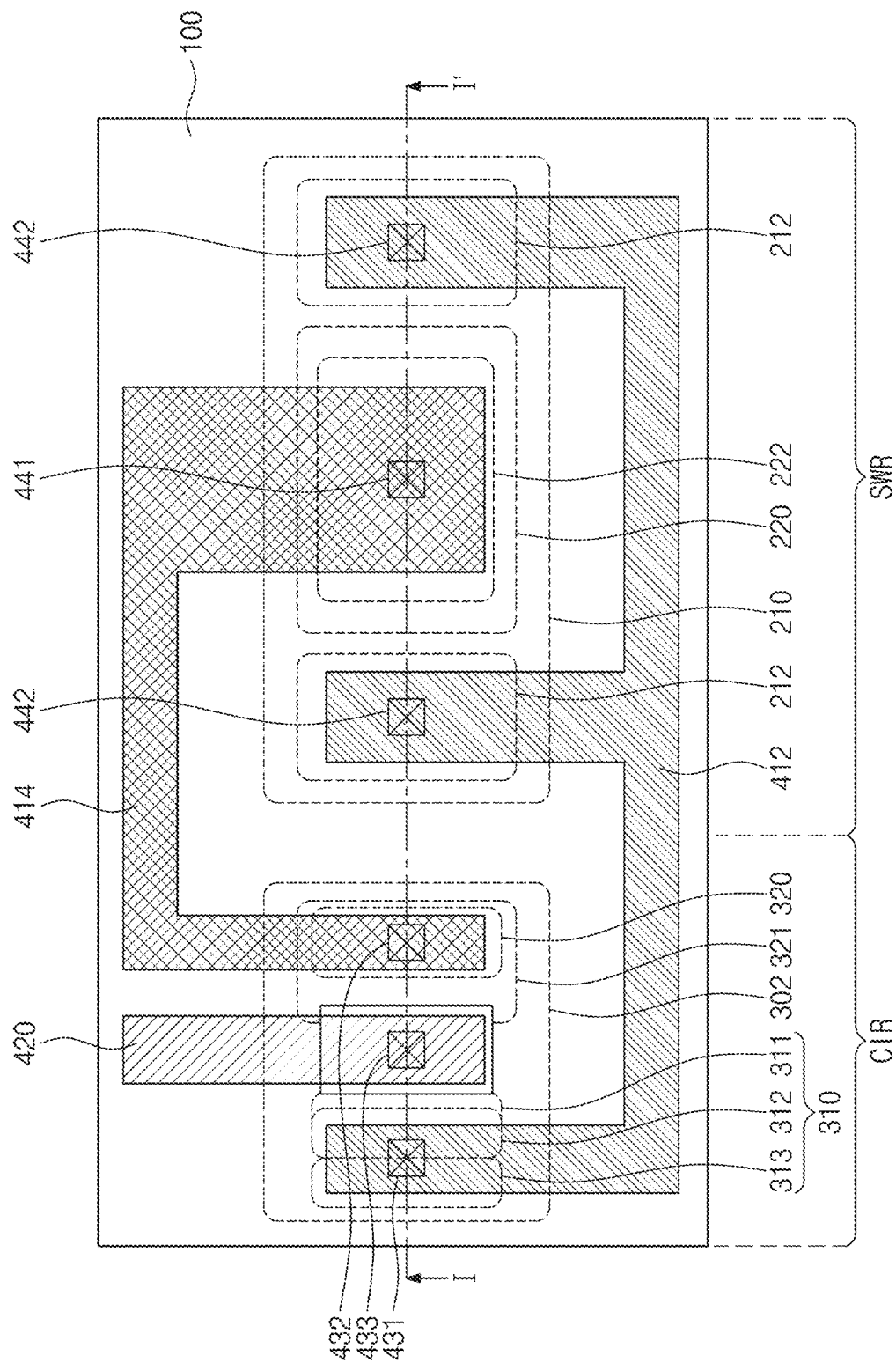
FIG. 3 is a plan view of monolithic metal-insulator transition devices according to embodiments of the inventive concept.
Figure 4:
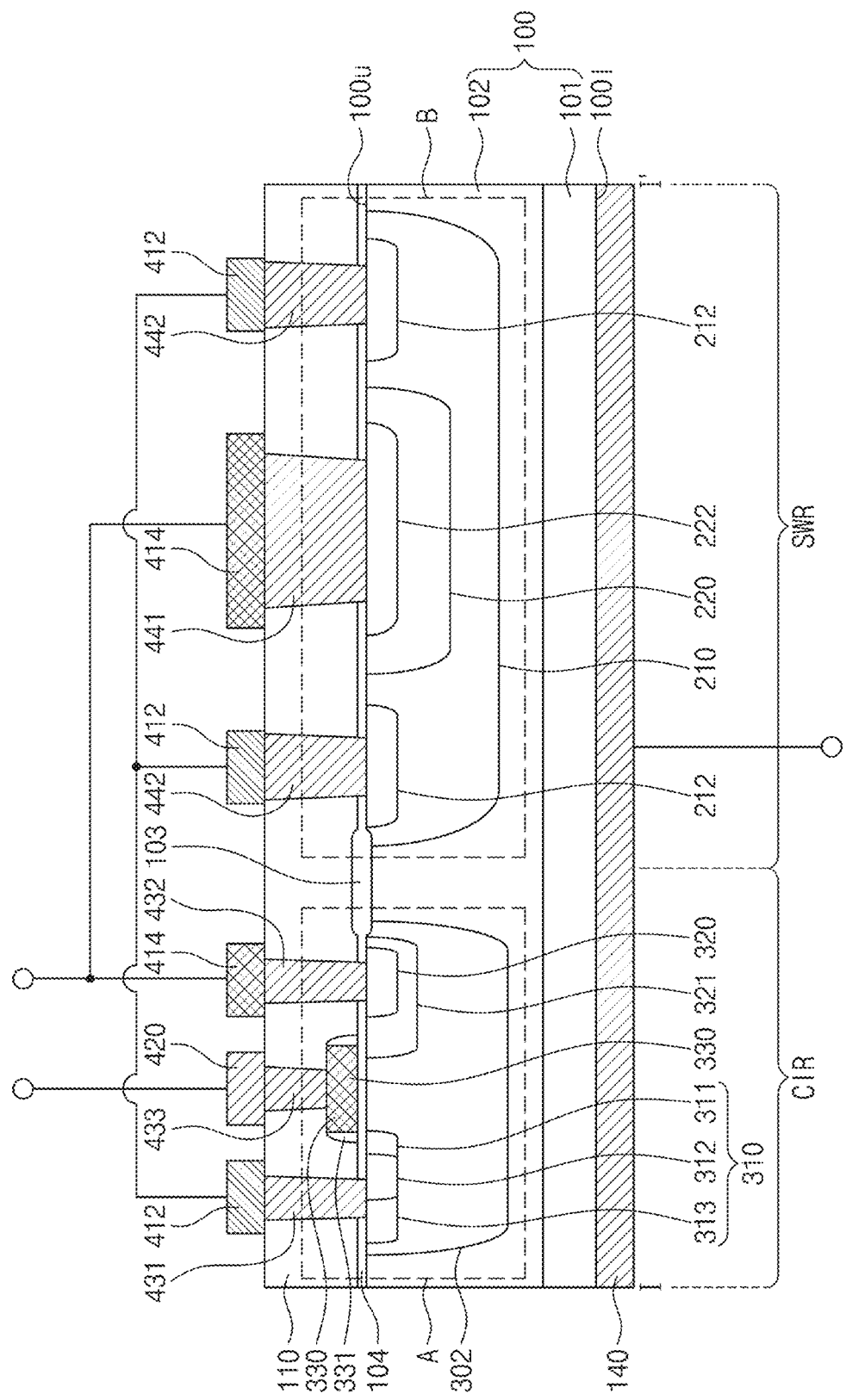
FIG. 4 is a cross-sectional view taken along I-I' of FIG. 3.

FIG. 3 is a plan view of monolithic metal-insulator transition devices according to embodiments of the inventive concept. FIG. 4 is a cross-sectional view taken along I-I' of FIG. 3.

Referring FIG. 3 and FIG. 4, a substrate 100 including a switching region SWR and a driving region CIR may be provided. The substrate 100 may be a semiconductor substrate, and may include, for example, one among silicon, silicon carbide, and silicon germanium. The switching region SWR and the driving region CIR may each include the metal-insulator transition transistor MITTR and the auxiliary transistor STR described with reference to FIG. 1 and FIG. 2. The switching region SWR and the driving region CIR may be horizontally adjacent to each other on the substrate 100. That is, the metal-insulator transition transistor MITTR and the auxiliary transistor STR according to embodiments of the present invention may be monolithically integrated on a single semiconductor substrate.

The substrate 100 may have a first conductivity type. In other words, the substrate 100 may be doped with impurities of the first conductivity type, and may include impurities of the first conductivity type. The first conductivity type may include an n-type or a p-type. For example, when the substrate 100 is a silicon (Si) substrate, the n-type impurities may include phosphorus (P), arsenic (As), antimony (Sb), bismuth (Bi), and the like, and the p-type impurities may include boron (B), aluminum (Al), gallium (Ga), indium (In), and the like.

The substrate 100 may include a lower layer 101 and an upper layer 102 on the lower layer 101. The lower layer 101 may include, for example, a silicon wafer. The upper layer 102 may include an epitaxial layer grown from the lower layer 101. The lower layer 101 and the upper layer 102 may have different impurity concentrations. For example, the impurity concentration of the upper layer 102 may be lower than that of the lower layer 101.

Impurity regions may be provided on the switching region SWR and the driving region CIR of the substrate 100. The impurity regions may be regions doped with a different dose from the substrate 100 in the substrate 100. Each of the impurity regions may have a conductivity type same as or different from the substrate 100. For example, the impurity regions on the switching region SWR may include a control well region 210, an inlet well region 220, an inlet contact region 222, and control contact regions 212. For example, the impurity regions on the driving region CIR may include a channel well region 302, a first source/drain region 310, a second source/drain region 320, and an extension region 321. Hereinafter, for a concise description of embodiments of the present invention, terms meaning the boundary of an impurity region (e.g., the bottom of an impurity region) may be used. The impurity regions may have a peak concentration in a region adjacent to an upper surface 100u of the substrate 100, and may have a smaller concentration as they become closer to a lower surface 100l of the substrate 100. In the present disclosure, the boundary of an impurity region may be defined as a portion having an impurity concentration of 1% or greater based on a portion in which the peak concentration of the impurity region appears. The first source/drain region 310 may be one of a source region and a drain region. The second source/drain region 320 may be one of a source region and a drain region, which is different from the first source/drain region 310.

The control well region 210 may be provided on the substrate 100 of the switching region SWR. The control well region 210 may be a region doped with impurities of a conductivity type different from the substrate 100 in the substrate 100. The control well region 210 may have a second conductivity type which is different from the first conductivity type. For example, when the substrate 100 has an n-type, the control well region 210 may have a p-type.

The control well region 210 may be formed on an upper portion of the substrate 100, and may have a bottom close to the lower surface 100*l* than to the upper surface 100*u* of the substrate 100. According to embodiments, the control well region 210 may have an impurity concentration gradually decreasing from the upper surface 100*u* of the substrate 100 toward the lower surface 100*l* thereof.

The control contact regions 212 may be provided in the control well region 210. The control contact regions 212 may be positioned adjacent to the upper surface 100*u* of the substrate 100. The control contact regions 212 may be spaced apart from each other with the inlet well region 220 to be described later interposed therebetween. The control contact regions 212 may have the second conductivity type. Each of the control contact regions 212 may have a higher impurity concentration than the control well region 210.

The inlet well region 220 may be provided in the control well region 210. The inlet well region 220 may have the first conductivity type. The inlet well region 220 may be positioned between the control contact regions 212. A bottom of the inlet well region 220 may be at a lower level than bottoms of the control contact regions 212. The bottom of the inlet well region 220 may be positioned in a higher region than the bottom of the control well region 210. In other words, at least a portion of the control well region 210 may be positioned between the inlet well region 220 and the lower surface 100*l* of the substrate 100.

The inlet contact region 222 may be provided in the inlet well region 220. The inlet contact region 222 may have the first conductivity type. The inlet contact region 222 may have a higher impurity concentration than the inlet well region 220.

The channel well region 302 may be provided on the substrate 100 of the driving region CIR. The channel well region 302 may be horizontally spaced apart from the control well region 210. The channel well region 302 may be electrically insulated from the control well region 210. According to embodiments, a device isolation region may be formed between the control well region 210 and the channel well region 302. As an example, the device isolation region may include impurities of the second conductivity type doped at a high concentration. As another example, the device isolation region may include a trench and an insulation film filling the trench.

The first source/drain region 310 and the second source/drain region 320 may be provided in the channel well region 302. The first and second source/drain regions 310 and 320 may be spaced apart from each other with a gate electrode 330 interposed therebetween. A source/drain region may refer to one of a source region and a drain region. For example, the first source/drain region 310 may be one of a source region and a drain region, and the second source/drain region 320 may be one of a source region and a drain region, which is different from the first source/drain region 310. For example, the first and second source/drain regions 310 and 320 may respectively be the source S and the drain D of the auxiliary transistor STR described with reference to FIG. 1.

The gate electrode 330 may be formed between the first source/drain region 310 and the second source/drain region 320. The gate electrode 330 may include, for example, polysilicon. A gate spacer 331 may be provided on a sidewall of the gate electrode 330. The gate spacer 331 may not cover an upper surface of the gate electrode 330. The gate spacer 331 may include, for example, at least one of a silicon oxide and a silicon nitride.

The first source/drain region 310 may include a first impurity region 311, a second impurity region 312, and a third impurity region 313. The second impurity region 312 may be positioned between the first impurity region 311 and the third impurity region 313. The first impurity region 311 and the second impurity region 312 may have the first conductivity type. The third impurity region 313 may have the second conductivity type. At this time, the first impurity region 311 may have a lower impurity concentration than the second impurity region 312.

The second source/drain region 320 may have the first conductivity type. The second source/drain region 320 may be horizontally spaced apart from the sidewall of the gate electrode 330.

The extension region 321 having a bottom positioned at a lower level than the second source/drain region 320 may be provided on the second source/drain region 320. The extension region 321 may surround the second source/drain region 320. The extension region 321 may extend below the gate electrode 330. The extension region 321 may have a lower impurity concentration than the second source/drain region 320.

An upper insulation film 104 may be provided on the upper surface 100*u* of the substrate 100. The upper insulation film 104 may extend between the gate electrode 330 and the channel well region 302 and function as a gate insulation film. The upper insulation film 104 may be formed on the entire upper surface 100*u* of the substrate 100. The upper insulation film 104 may include, for example, a silicon oxide.

A field insulation film 103 may be provided between the switching region SWR and the driving region CIR. The field insulation film 103 may be connected to the upper insulation film 104. The field insulation film 103 may be thicker than the upper insulation film 104. The field insulation film 103 may include, for example, a silicon oxide.

An interlayer insulation film 110 may be provided on the upper surface 100*u* of the substrate 100. The interlayer insulation film 110 may cover the gate electrode 330, the gate spacer 331, the upper insulation film 104, and the field insulation film 103. The interlayer insulation film 110 may include, for example, one among a silicon oxide, a silicon nitride, and a silicon oxynitride.

A first wiring 412, a second wiring 414, and a third wiring 420 may be provided on the interlayer insulation film 110. The first wiring 412 may electrically connect the first source/drain region 310 and the control well region 210. The second wiring 414 may electrically connect the second source/drain region 320 and the inlet well region 220. The first wiring 412 and the second wiring 414 may be electrically insulated from each other. The third wiring 420 may be electrically connected to the gate electrode 330. The first wiring 412, the second wiring 414, and the third wiring 420 may be electrically separated from each other. The second wiring 414 and the third wire 420 may be connected to different terminals and be independently controlled.

A first contact 431 and a second contact 432 may be respectively connected to the first source/drain region 310 and the second source/drain region 320 through the interlayer insulation film 110 and the upper insulation film 104. A lower end of the first contact 431 may be in contact with the second impurity region 312 and the third impurity region 313. A lower end of the second contact 432 may be in contact with the second source/drain region 320. The first contact 431 may electrically connect the first source/drain region 310 and the first wiring 412. The second contact 432 may electrically connect the second source/drain region 320 and the second wiring 414.

A gate contact 433 may be connected to the gate electrode 330 through the interlayer insulation film 110. The gate contact 433 may electrically connect the gate electrode 330 and the third wiring 420.

An inlet contact 441 may be connected to the inlet contact region 222 through the interlayer insulation film 110 and the upper insulation film 104. The inlet contact 441 may be connected to the inlet well region 220 through the inlet contact region 222. The inlet contact 441 may electrically connect the inlet well region 220 to the second wiring 414.

Control contacts 442 may be respectively connected to the control contact regions 212 through the interlayer insulation film 110 and the upper insulation film 104. The control contacts 442 may be connected to the control well region 210 through the control contact regions 212. The control contacts 442 may electrically connect the control well region 210 to the first wiring 412.

A lower electrode 140 may be provided on the lower surface 100l of the substrate 100. The lower electrode 140 may cover the entire lower surface 100l of the substrate 100. In other words, the lower electrode 140 may be vertically overlapped with the impurity regions of the switching region SWR and the driving region CIR of the substrate 100. The lower electrode 140 may be electrically connected to the lower layer 101 of the substrate 100.

Figure 5A:
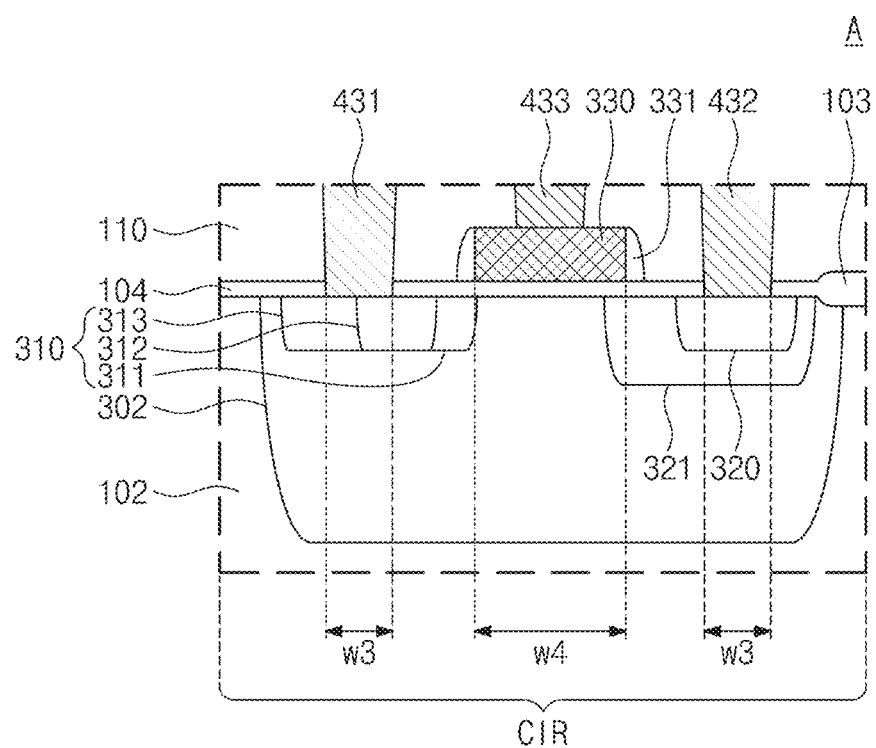
FIG. 5A and FIG. 5B are respectively enlarged cross-sectional views of portion A and portion B of FIG. 4.
Figure 5B:
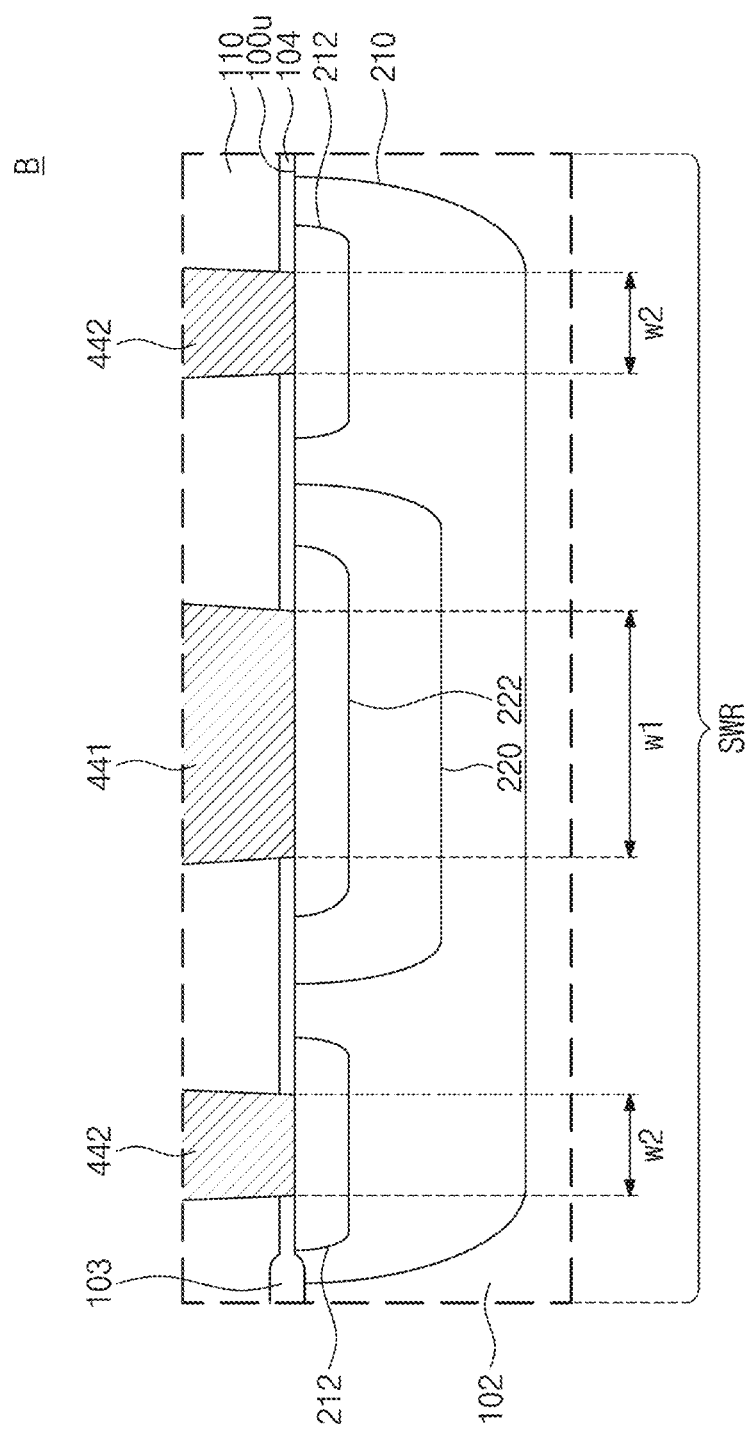

FIG. 5A and FIG. 5B are respectively enlarged cross-sectional views of portion A and portion B of FIG. 4.

Referring to FIG. 4, FIG. 5A and FIG. 5B, the monolithic metal-insulator transition device may be a power semiconductor device that receives power through the inlet contact 441 and outputs power through the lower electrode 140. A higher current may be applied to the inlet contact 441 and the lower electrode 140 than to the first and second contacts 431 and 432. For example, the inlet contact 441 may be connected in parallel with the second contact 432, but may be configured to receive a higher current than the second contact 432. A width w1 of a lower end of the inlet contact 441 may be larger than widths w3 of the lower ends of the first and second contacts 431 and 432. A contact area between the lower end of the inlet contact 441 and the inlet contact area 222 may be larger than a contact area between the lower ends of the first and second contacts 431 and 432 and the first and second source/drain regions 310 and 320. As a result, electrical reliability of the monolithic metal-insulator transition device may be improved.

According to embodiments, the width w1 of the lower end of the inlet contact 441 may be larger than widths w2 of lower ends of the control contacts and 442. The width w1 of the lower end of the inlet contact 441 may be larger than a width w4 of the gate electrode 330. Each of the widths w2 of the lower ends of the control contacts 442 may be larger than each of the widths w3 of the lower ends of the first and second contacts 431 and 432.

FIG. 6A to FIG. 6H are graphs showing electrical properties of a monolithic metal-insulator transition device manufactured according to embodiments of the present invention. Specifically, FIG. 6A to FIG. 6H show electrical properties of monolithic metal-insulator transition devices measured according to Experimental Example 1 to Experimental Example 6.

Experimental Example 1

Figure 6A:
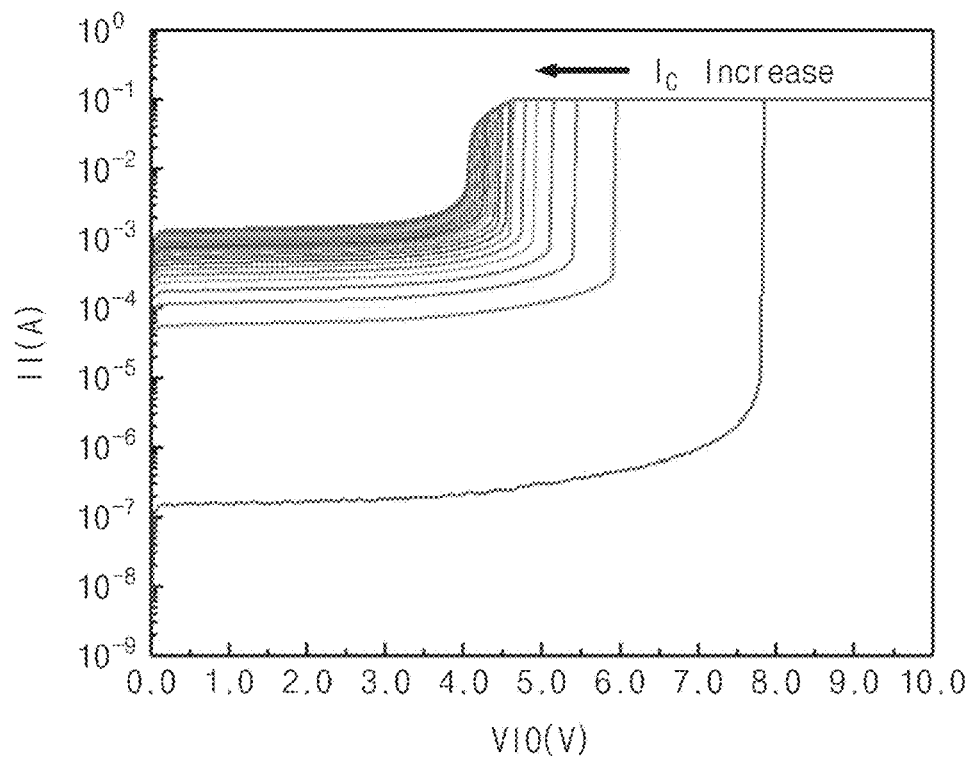
FIG. 6A to FIG. 6H are graphs showing electrical properties of monolithic metal-insulator transition devices according to embodiments of the inventive concept measured according to Experimental Example 1 to Experimental Example 6.

A constant current was applied to a control terminal of a monolithic metal-insulator transition device according to embodiments of the inventive concept. An inlet current II was measured while linearly increasing a voltage $V_{IO}$ applied to both ends of an inlet terminal and an outlet terminal of a metal-insulator transition transistor, and is shown in FIG. 6A. The electrical properties of the metal-insulator transition transistor were measured using a Keysight 4156 semiconductor parameter analyzer.

Referring to FIG. 6A, if the voltage $V_{IO}$ between the inlet terminal and the outlet terminal is increased when a constant current Ic applied to the control terminal is 0 A, it can be confirmed that the inlet current II discontinuously increases (discontinuous jump). In addition, it can be seen that the voltage $V_{IO}$ between the inlet terminal and the outlet terminal decreases in the discontinuous jump. When the constant current Ic applied to the control terminal increases, the voltage $V_{IO}$ between the inlet terminal and the outlet terminal decreases in the discontinuous jump. In addition, it can be seen that the discontinuous jump is not observed when the voltage $V_{IO}$ between the inlet terminal and the outlet terminal is greater than a specific value.

Experimental Example 2

Figure 6B:
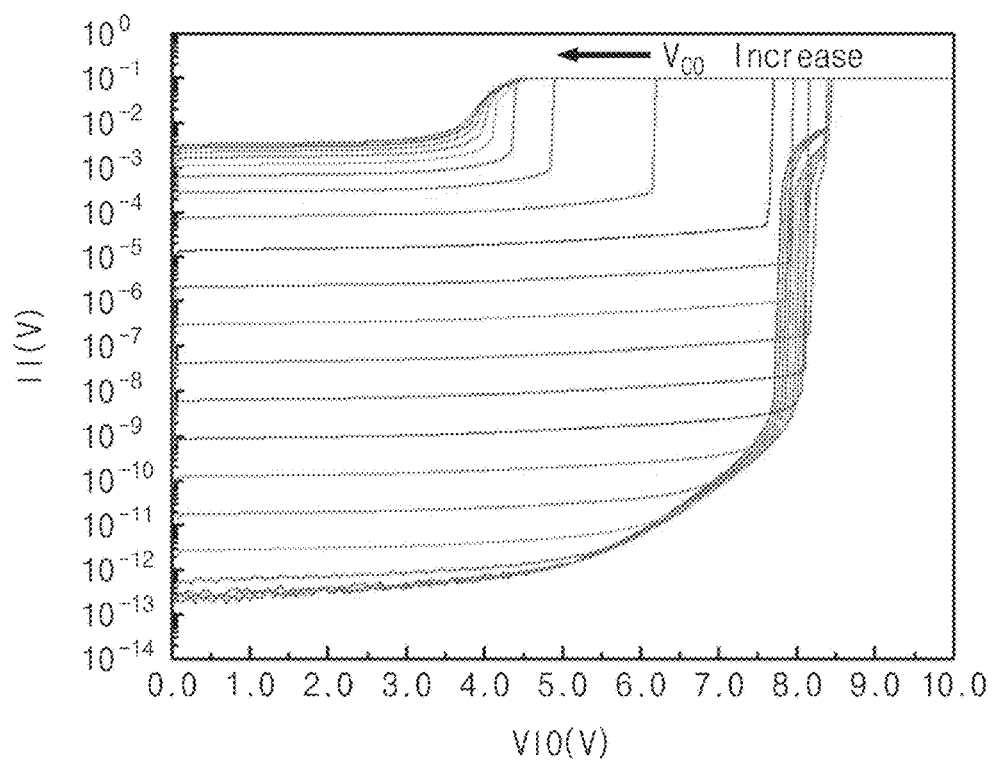

A constant voltage Vco was applied between a control terminal and an outlet terminal of a monolithic metal-insulator transition device according to embodiments of the inventive concept. An inlet current II was measured while increasing a voltage $V_{IO}$ applied to both ends of an inlet terminal and an outlet terminal of a metal-insulator transition transistor, and is shown in FIG. 6B. The electrical properties of the metal-insulator transition transistor were measured using a Keysight 4156 semiconductor parameter analyzer.

Referring to FIG. 6B, if the voltage $V_{IO}$ between the inlet terminal and the outlet terminal is increased when the voltage Vco between the control terminal and the outlet terminal is 0 A, it can be confirmed that the inlet current II discontinuously increases (discontinuous jump section). In addition, it can be seen that as the constant voltage Vco is increased, the voltage $V_{IO}$ between the inlet terminal and the outlet terminal decreases in the discontinuous jump section. In addition, it can be seen that the discontinuous jump section is not observed when the voltage Vco between the control terminal and the outlet terminal is greater than a specific value.

Experimental Example 3

Figure 6C:
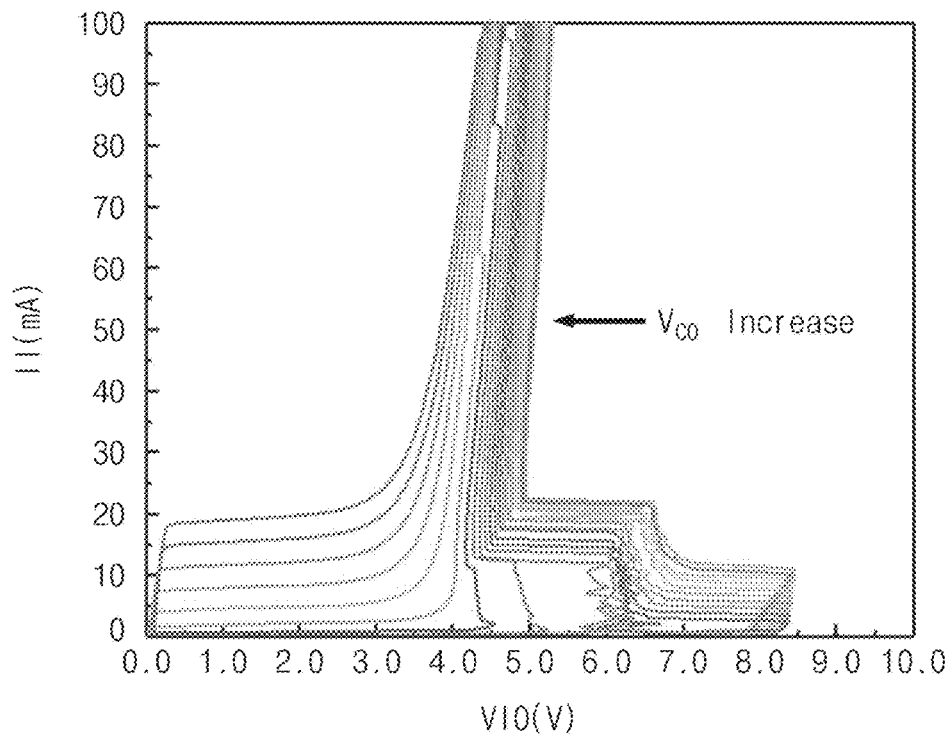

A constant voltage Vco was applied between a control terminal and an outlet terminal of a monolithic metal-insulator transition device according to embodiments of the inventive concept. A voltage $V_{IO}$ applied to both ends of an inlet terminal and an outlet terminal of a metal-insulator transition transistor was measured while increasing an inlet current II of the metal-insulator transition transistor, and is shown in FIG. 6C. The electrical properties of the metal-insulator transition transistor were measured using a Keysight 4156 semiconductor parameter analyzer.

Referring to FIG. 6C, if the inlet current II is increased when the voltage Vco between the control terminal and the outlet terminal is 0 A, the voltage $V_{IO}$ between the inlet terminal and the outlet terminal may rapidly decrease. In addition, when the voltage Vco between the control terminal and the outlet terminal increases, the voltage $V_{IO}$ between the inlet terminal and the outlet terminal may discontinuously decrease. Also, when the voltage Vco increases between the control terminal and the outlet terminal, the voltage between the inlet terminal and the outlet terminal may decrease in discontinuous jump. The voltage Vco between the control terminal and the outlet terminal may no longer exhibit a discontinuous decrease at a predetermined voltage or higher. The voltage Vco between the control terminal and the outlet terminal may continuously increase at a predetermined voltage or higher.

Referring back to FIG. 6A to FIG. 6C, the metal-insulator transition transistor according to embodiments of the inventive concept may operate in a negative differential resistance mode. Accordingly, on-resistance of the metal-insulator transition transistor may be decreased.

Experimental Example 4

Figure 6D:
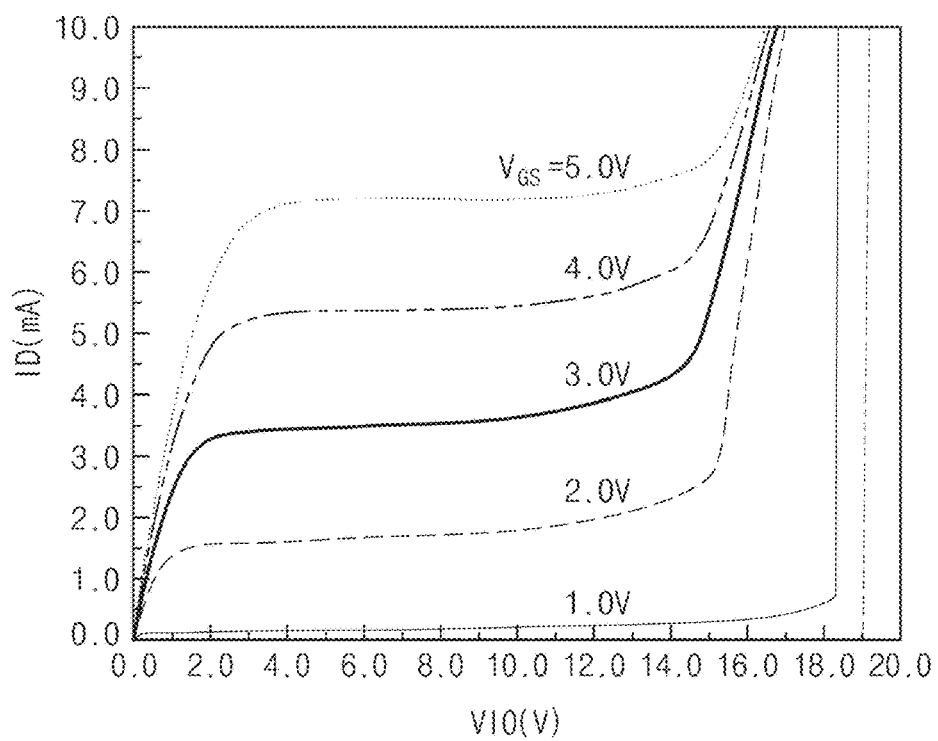
Figure 6E:
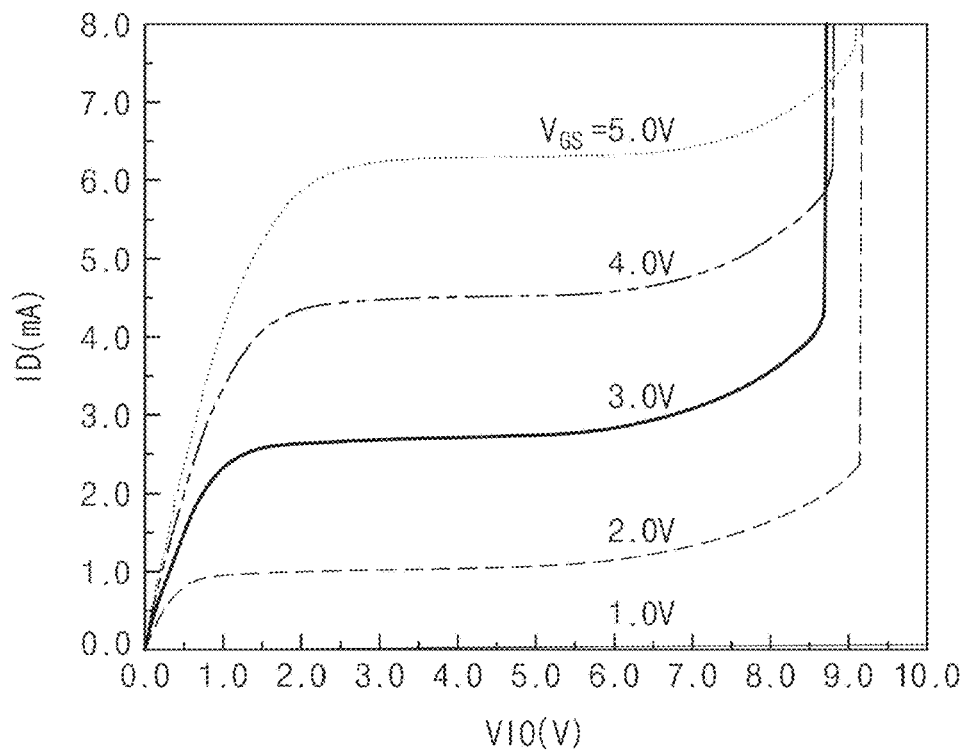

A monolithic metal-insulator transition device was formed according to embodiments of the inventive concept. A device breakdown voltage of an auxiliary transistor was measured, and is shown in FIG. 6D. The monolithic metal-insulator transition device was formed according to embodiments of the inventive concept, and the auxiliary transistor was formed without the extension region 321 described with reference to FIG. 4. A device breakdown voltage of the auxiliary transistor was measured, and is shown in FIG. 6E. The electrical properties of the metal-insulator transition transistor were measured using a Keysight 4156 semiconductor parameter analyzer.

Referring to FIG. 6D and FIG. 6E, it can be seen that the device breakdown voltage of the auxiliary transistor including the extension region 321 is higher than the device breakdown voltage of the auxiliary transistor formed without the extension region 321 (see FIG. 4). Since the auxiliary transistor may be connected in parallel with an inlet and a control of the metal-insulator transition transistor, it can be seen that reliability of the monolithic metal-insulator transition device may be improved by the extension region 321.

Experimental Example 5

Figure 6F:
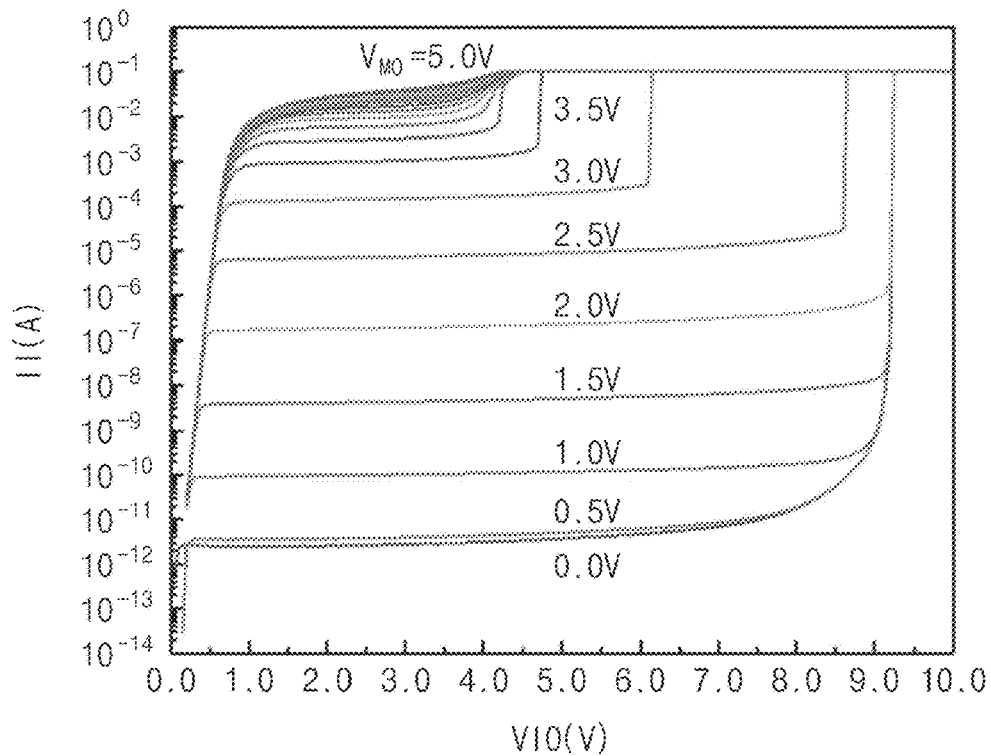
Figure 6G:
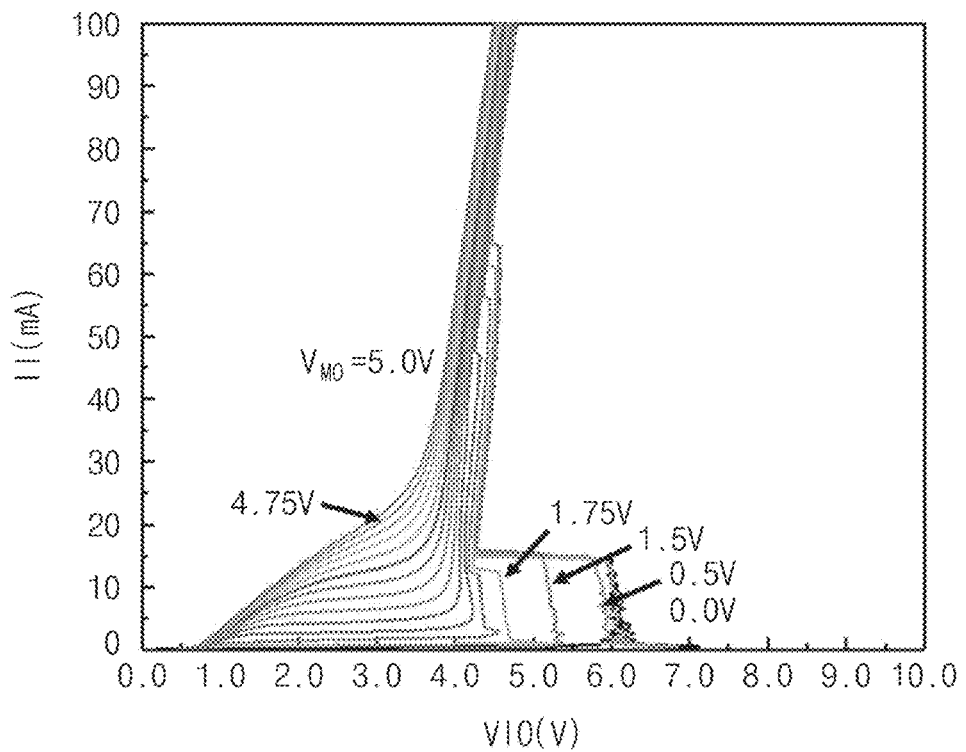

A monolithic metal-insulator transition device was formed according to embodiments of the inventive concept. While changing a voltage $V_{MO}$ applied to a gate of an auxiliary transistor, that is, a manager electrode M (refer to FIGS. 1 and 2), a current II flowing in an inlet terminal according to a voltage $V_{IO}$ between the inlet terminal and an outlet terminal of a metal-insulator transition transistor was measured, and is shown in FIG. 6F. A voltage $V_{MO}$ was applied between the gate of the auxiliary transistor and the outlet terminal of the metal-insulator transition transistor, and the current II flowing in the inlet terminal according to the voltage $V_{IO}$ between the inlet terminal and an outlet terminal was measured, and is shown in FIG. 6G. The electrical properties of the metal-insulator transition transistor were measured using a Keysight 4156 semiconductor parameter analyzer.

Referring to FIG. 6F and FIG. 6G, it can be seen that a discontinuous jump section is generated according to the supply of a critical current of the auxiliary transistor. As the voltage $V_{MO}$ applied to the gate of the auxiliary transistor increases, it can be seen that a voltage of the discontinuous jump section decreases. When the voltage $V_{MO}$ applied to the gate of the auxiliary transistor has a range greater than or equal to a predetermined value, it can be confirmed that the discontinuous jump section is not observed.

Experimental Example 6

Figure 6H:
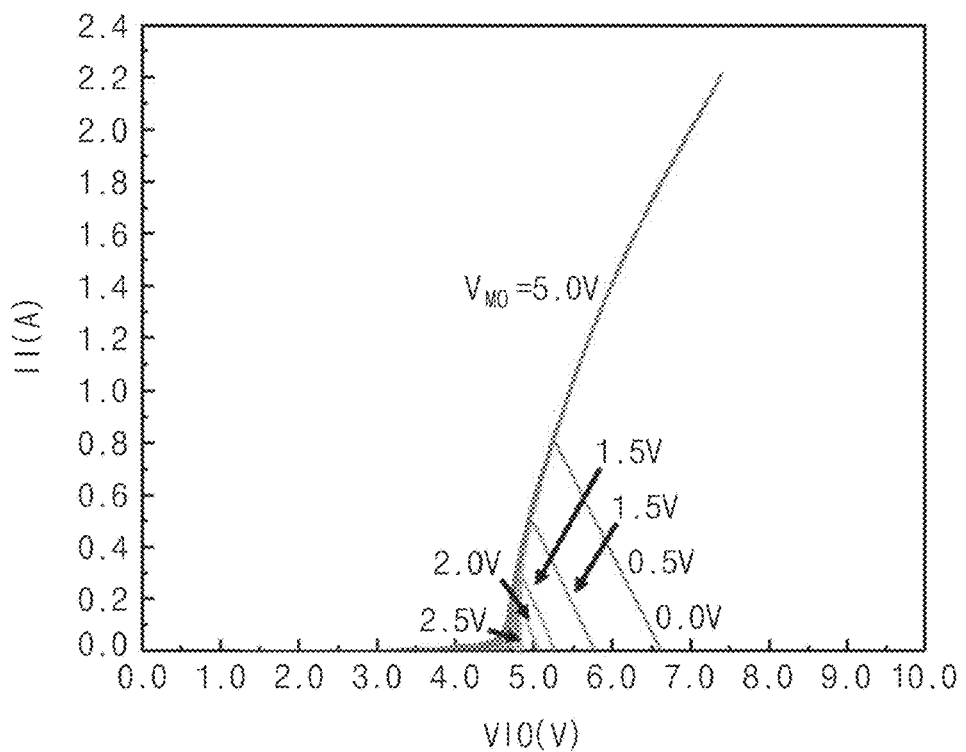

A monolithic metal-insulator transition device was formed according to embodiments of the inventive concept. Current and voltage properties of the monolithic metal-insulator transition device were measured using a Tektronix 370A Curve Trace, and are shown in FIG. 6H. The electrical properties of the metal-insulator transition transistor were measured using a Keysight 4156 semiconductor parameter analyzer.

Referring to FIG. 6H, it can be seen that on resistance of the metal-insulator transition transistor decreases according to a negative differential resistance mode operation of the monolithic metal-insulator transition device.

Figure 7:
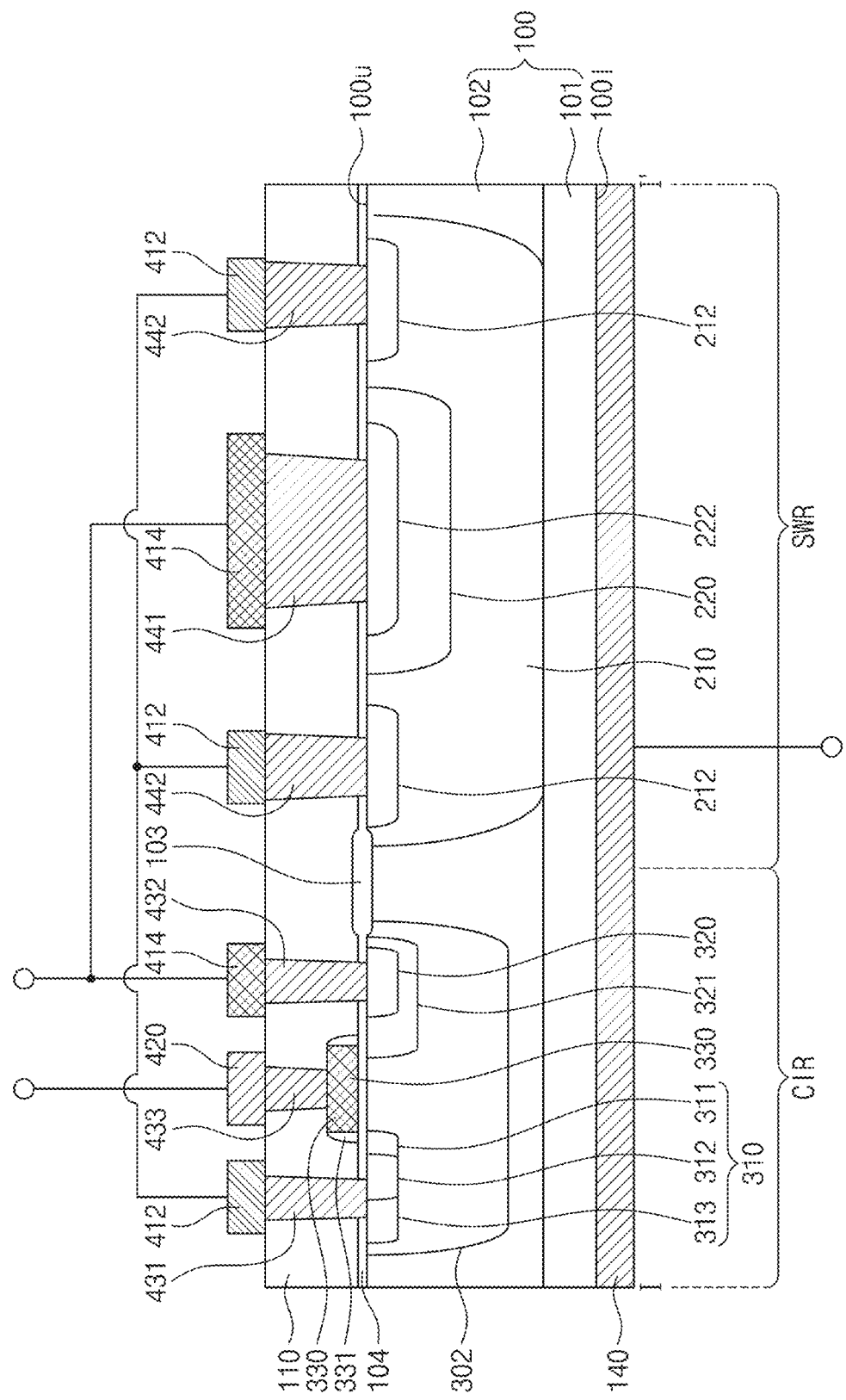
FIG. 7 is a cross-sectional view of a monolithic metal-insulator transition devices according to embodiments of the inventive concept.

FIG. 7 is a cross-sectional view of a monolithic metal-insulator transition devices according to embodiments of the present invention.

Referring to FIG. 7, the control well region 210 of the switching region SWR may be formed to be deeper than the channel well region 302 of the driving region CIR. The control well region 210 may be connected to the lower layer 101 of the substrate 100. A bottom of the control well region 210 may be positioned at a vertical level between A bottom of the channel well region 302 and the upper surface of the lower layer 101. The bottom of the control well region 210 may be positioned at a level not higher than the upper surface of the lower layer 101.

In an embodiment, the channel well region 302 of the driving region CIR may also be formed to have a bottom positioned at a level not higher than the upper surface of the lower layer 101.

Figure 8A:
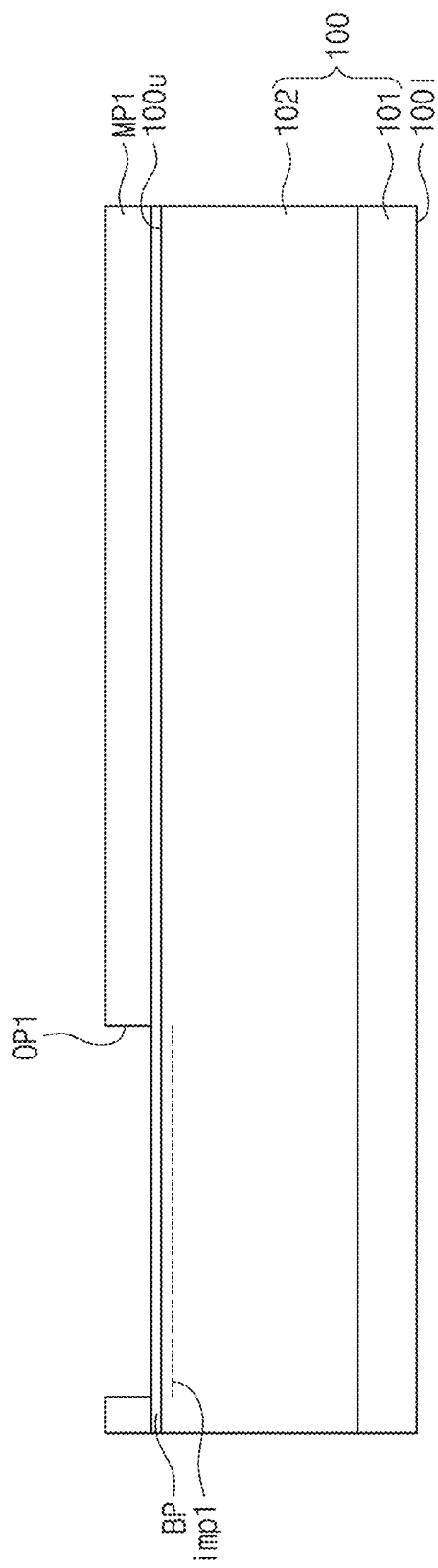
FIG. 8A to FIG. 8P are cross-sectional views for describing methods for manufacturing monolithic metal-insulator transition devices according to embodiments of the inventive concept.
Figure 8B:
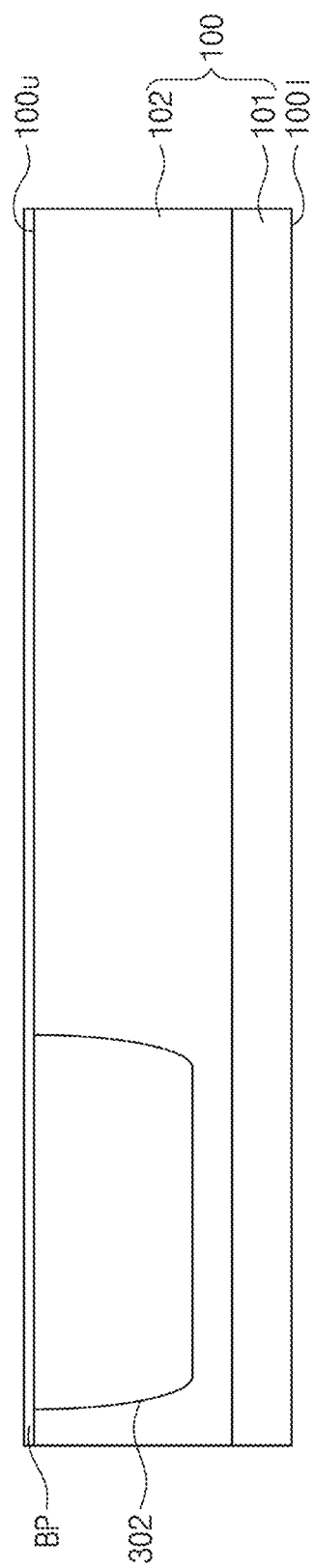
Figure 8C:
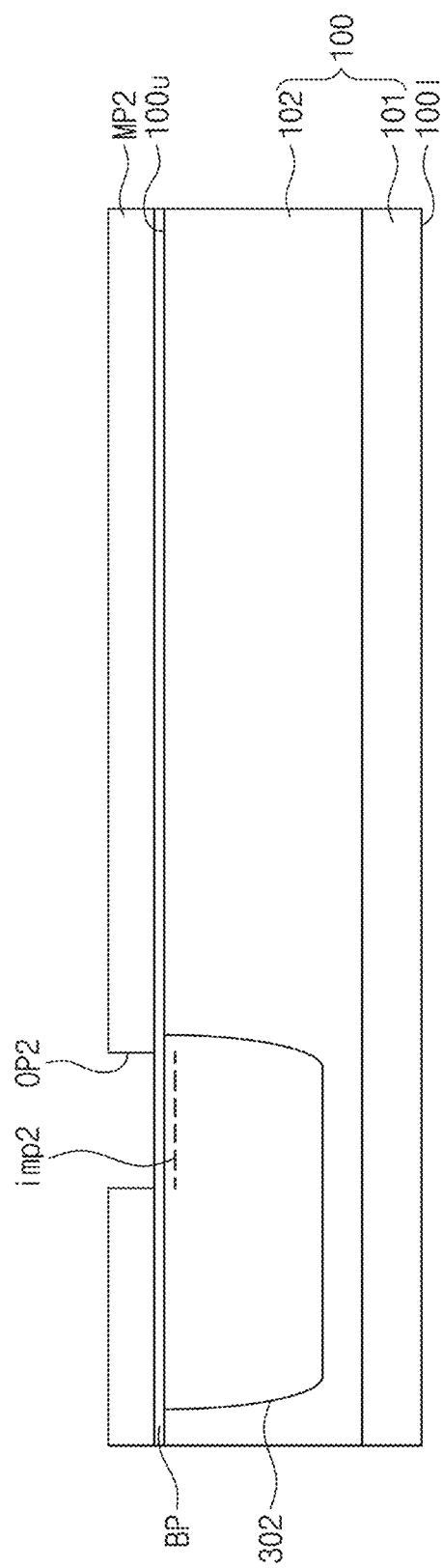
Figure 8D:
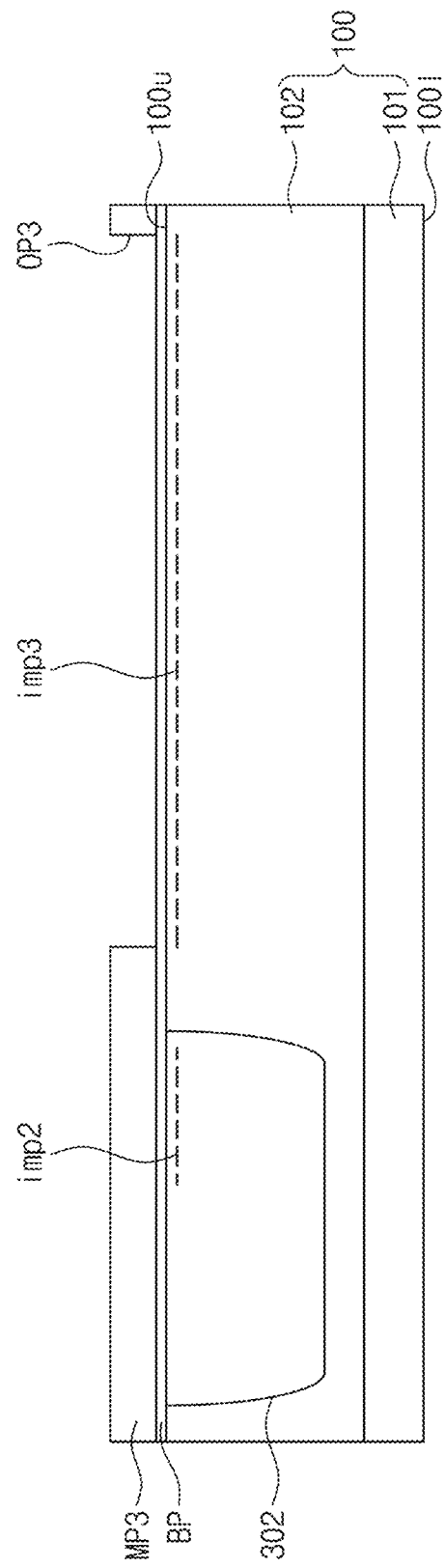
Figure 8E:
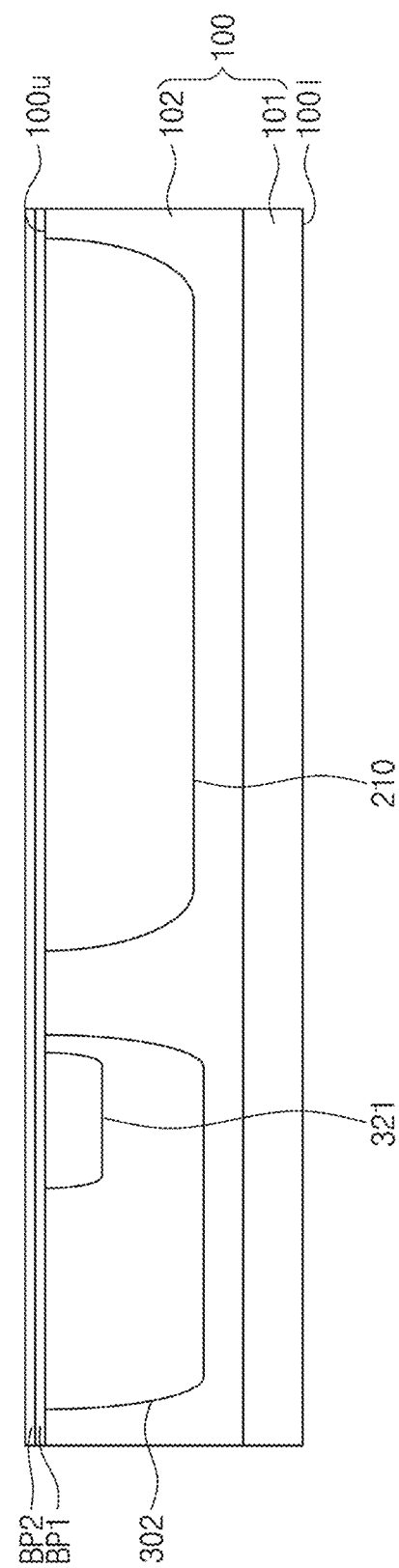
Figure 8F:
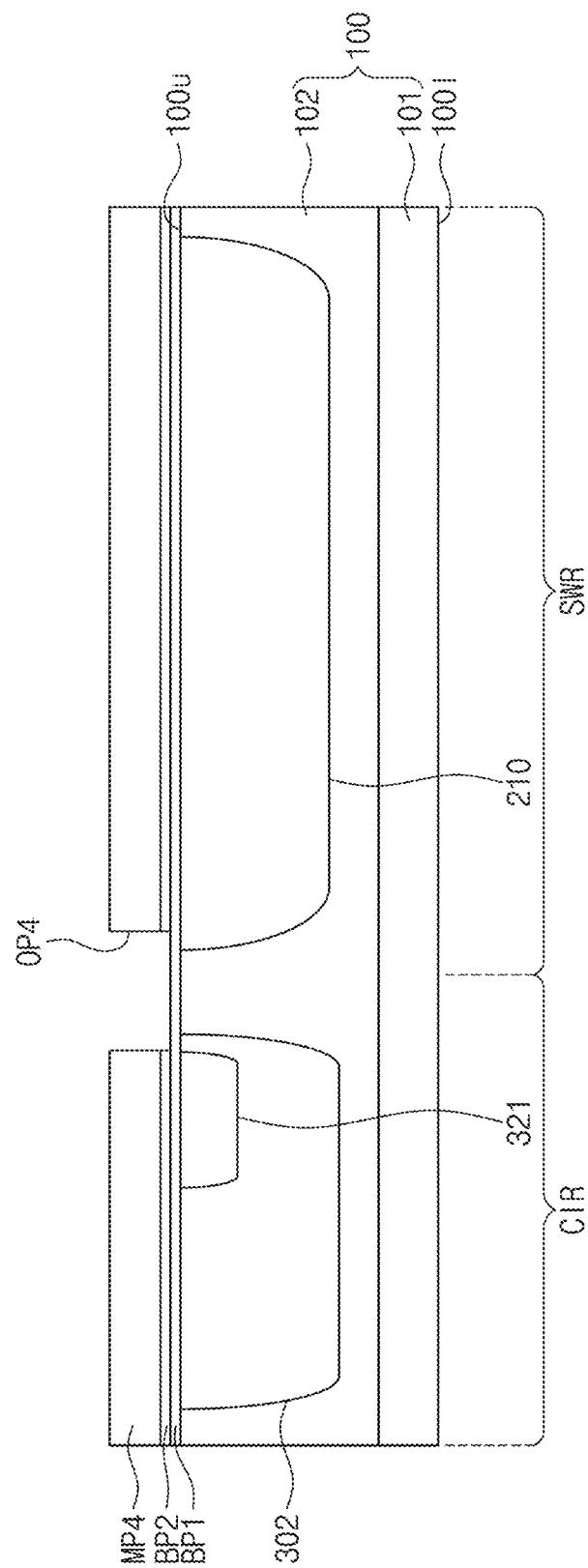
Figure 8G:
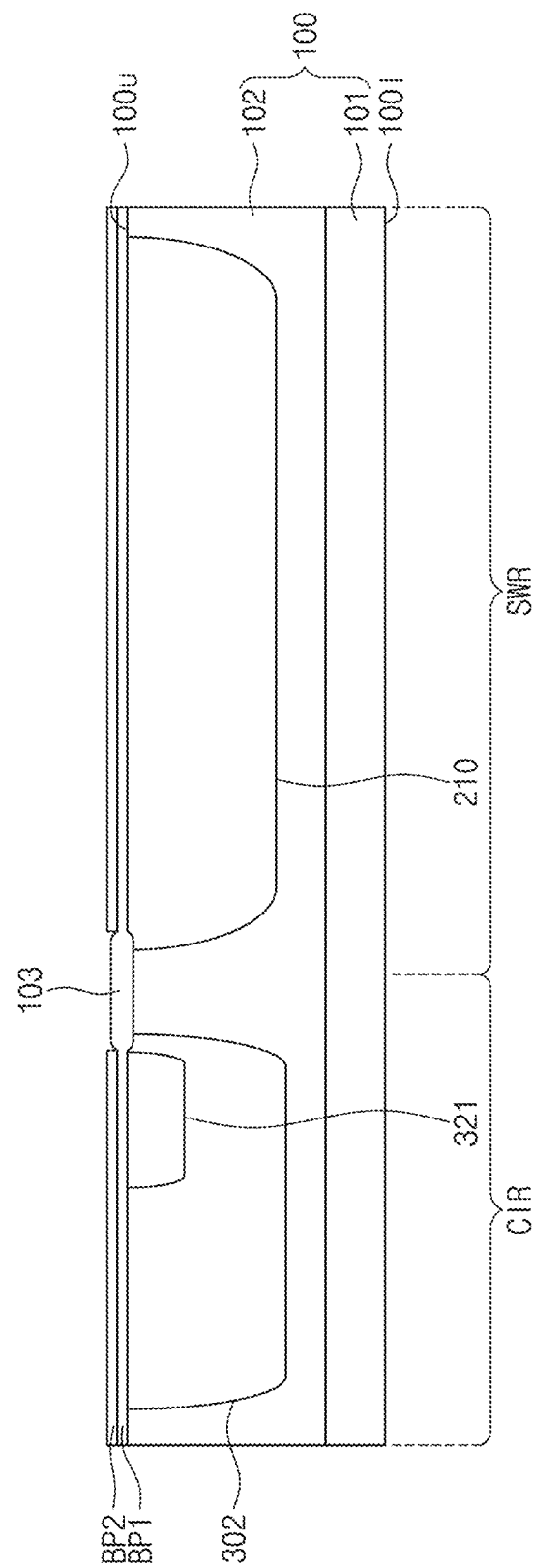
Figure 8H:
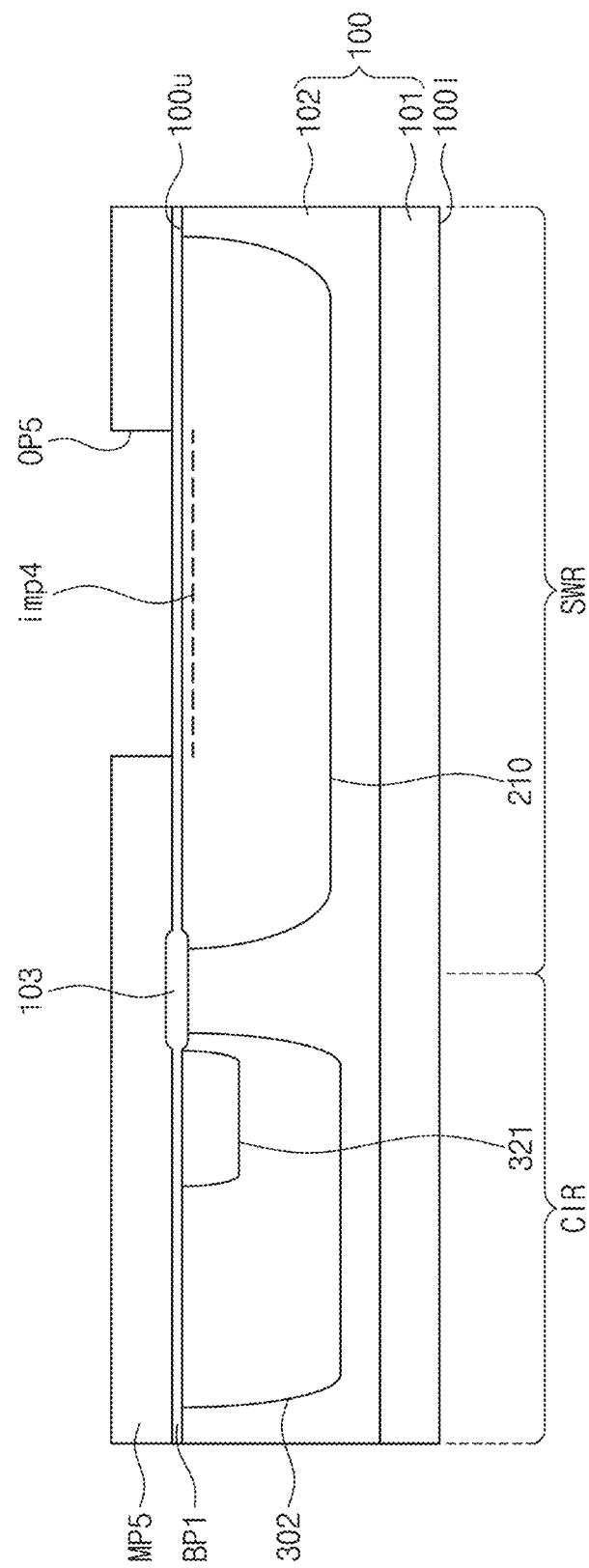
Figure 8I:
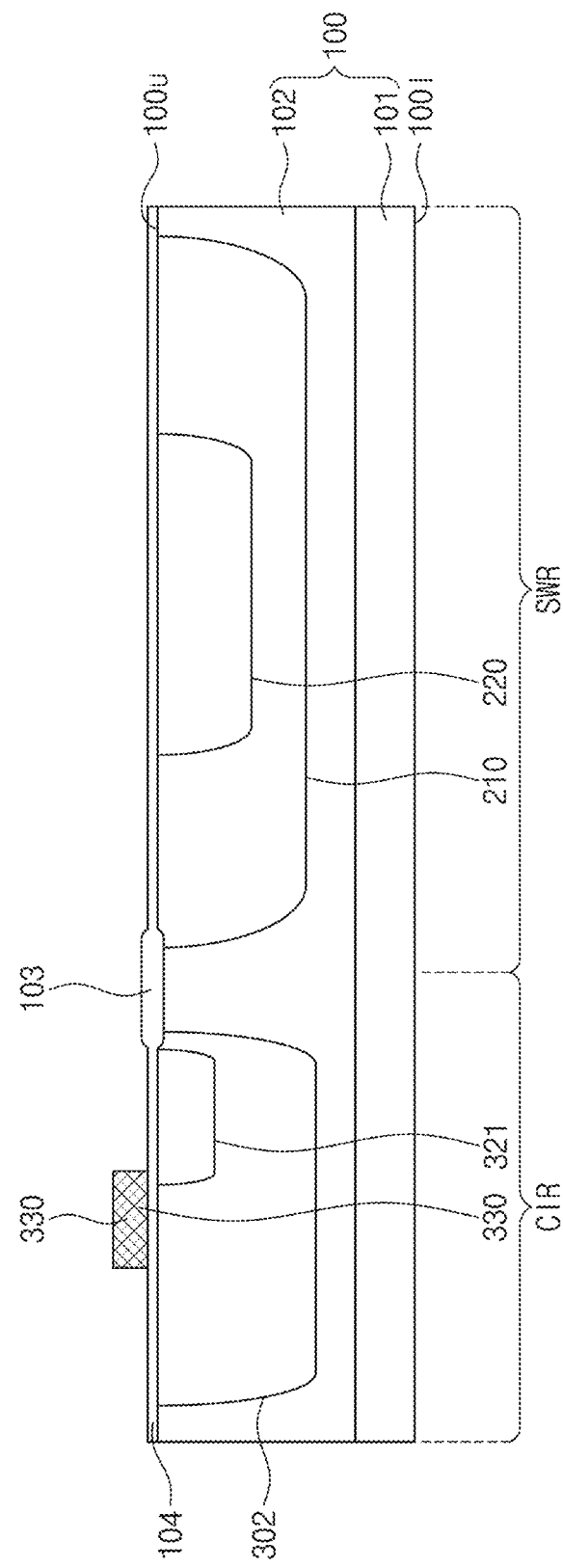
Figure 8J:
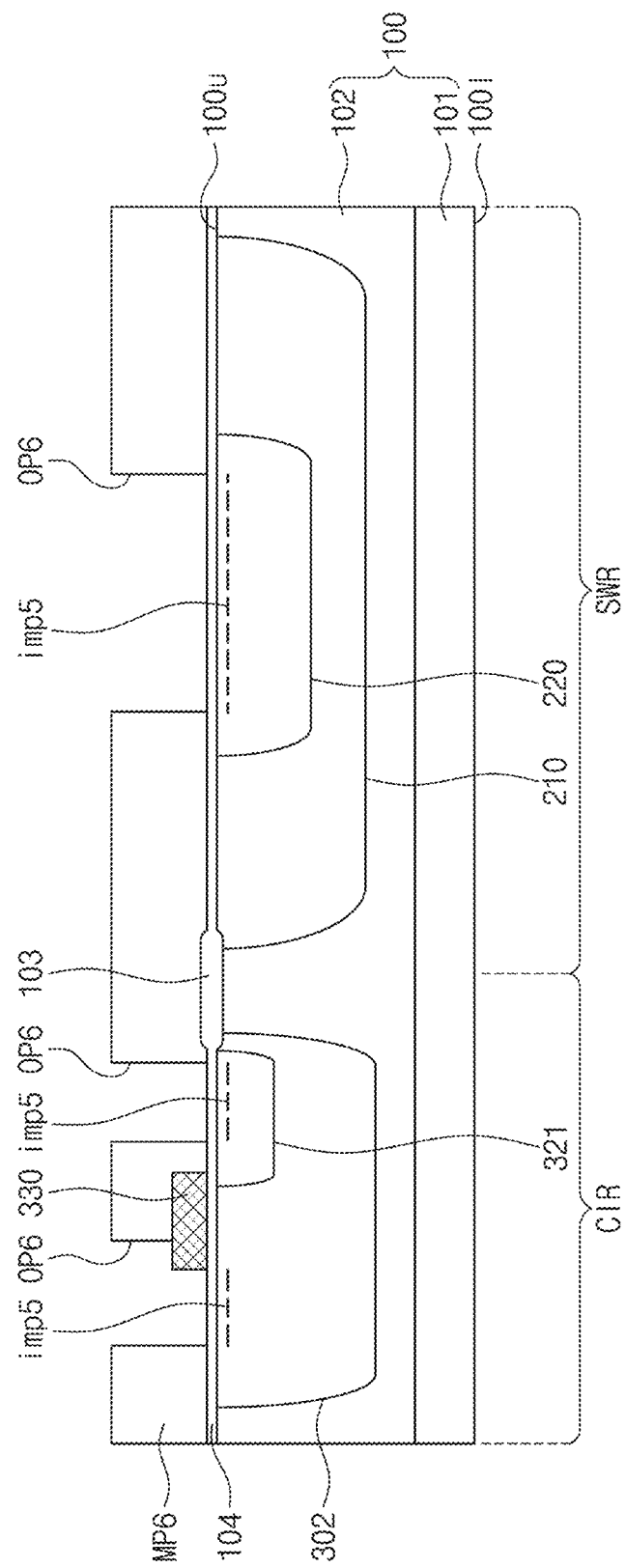
Figure 8K:
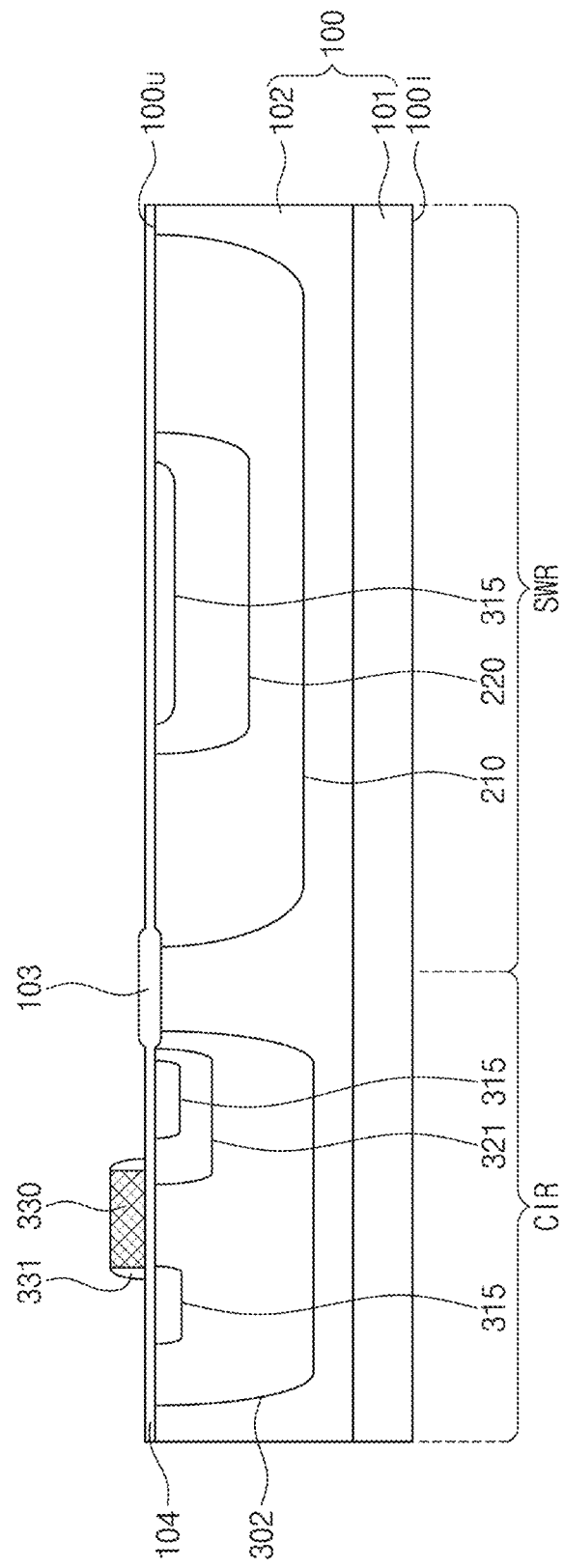
Figure 8L:
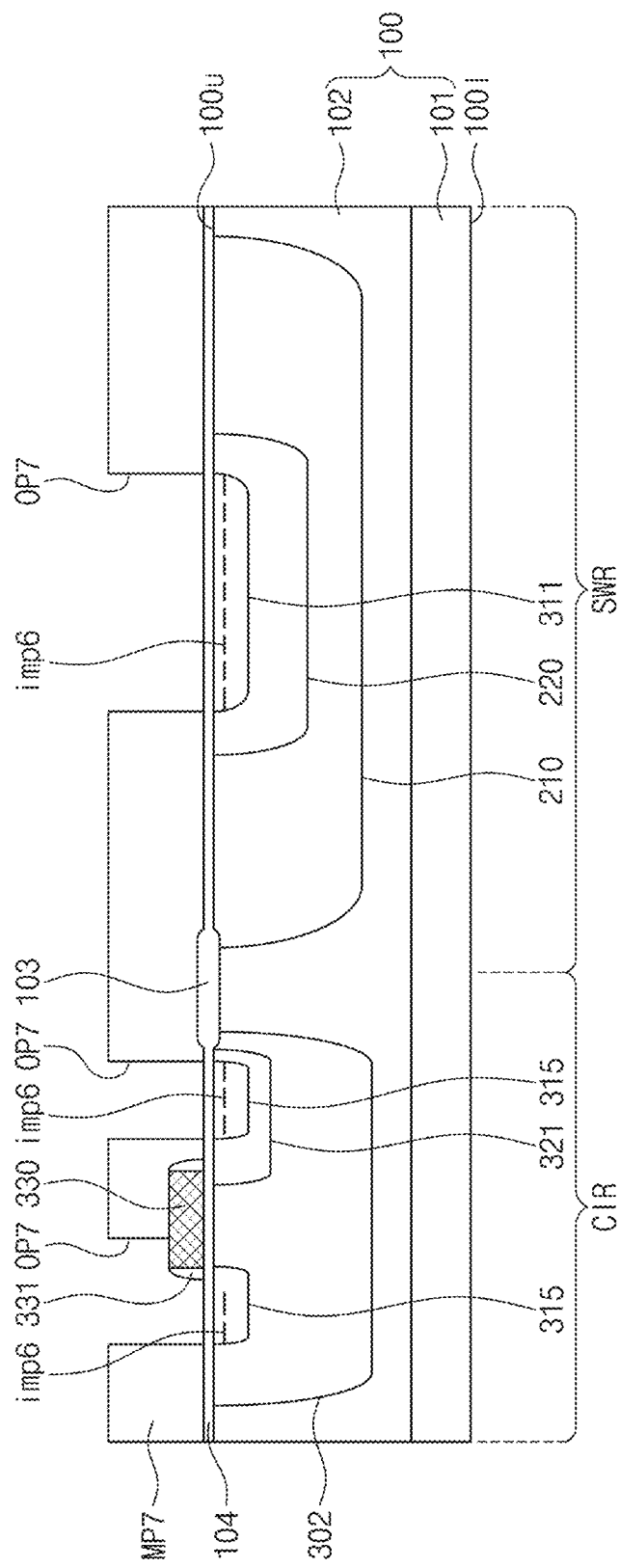
Figure 8M:
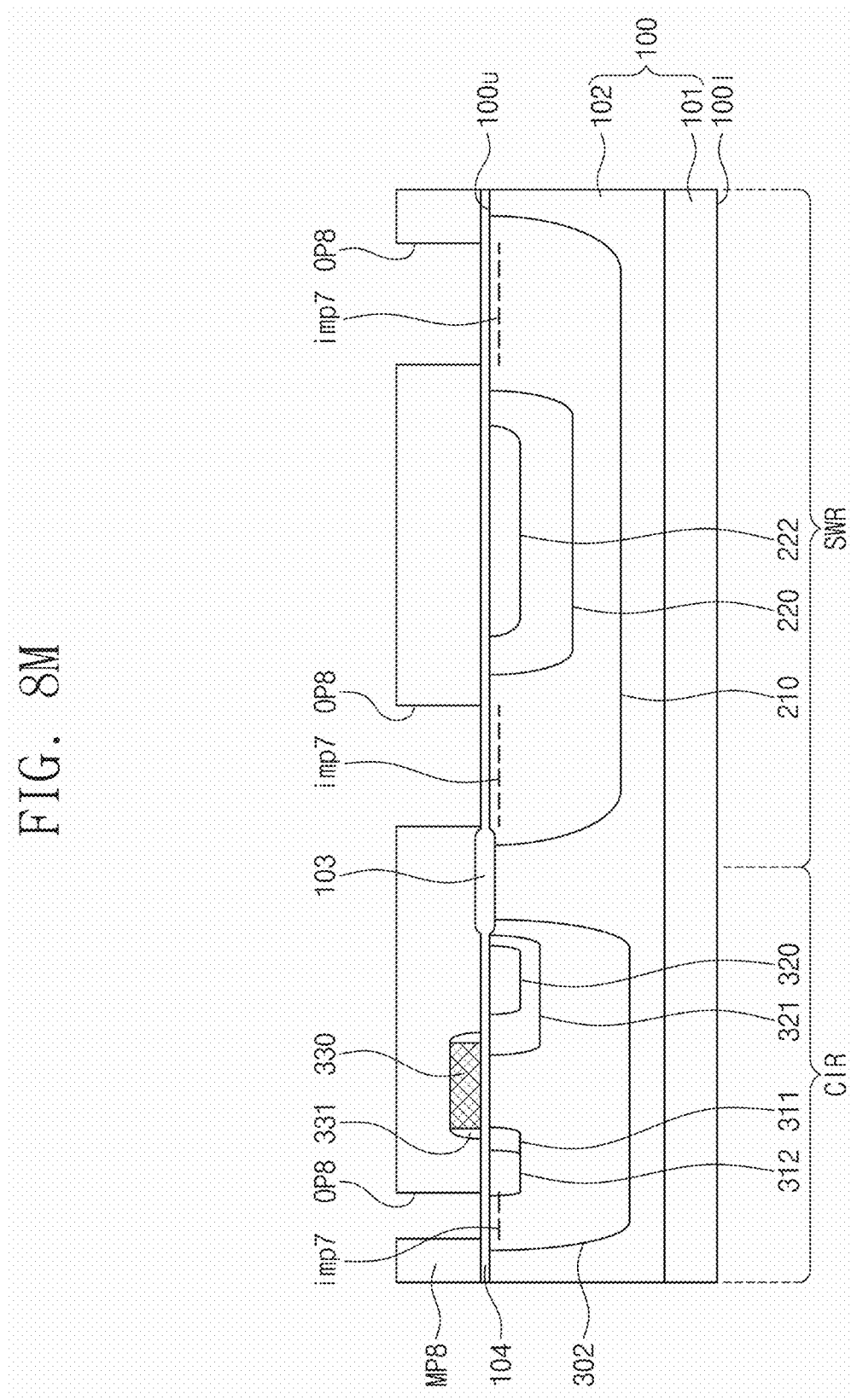
Figure 8N:
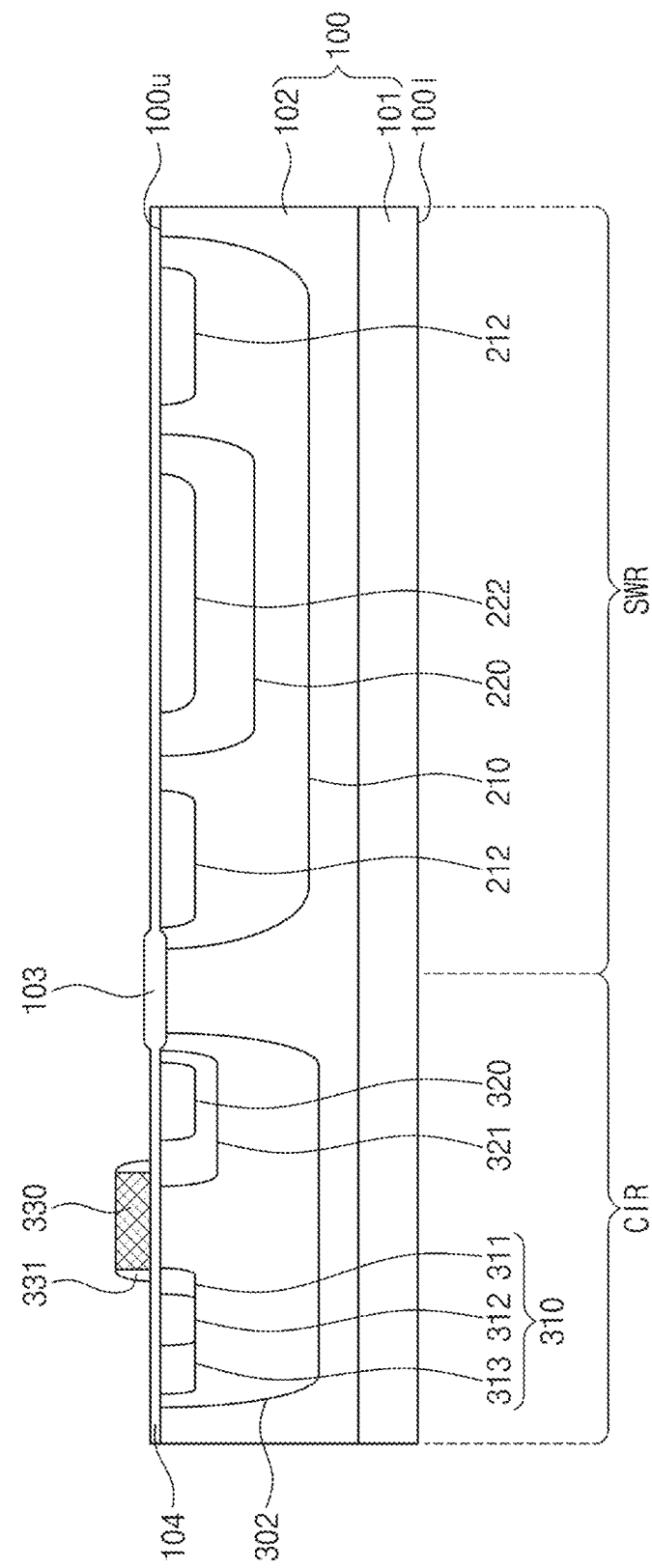
Figure 80:
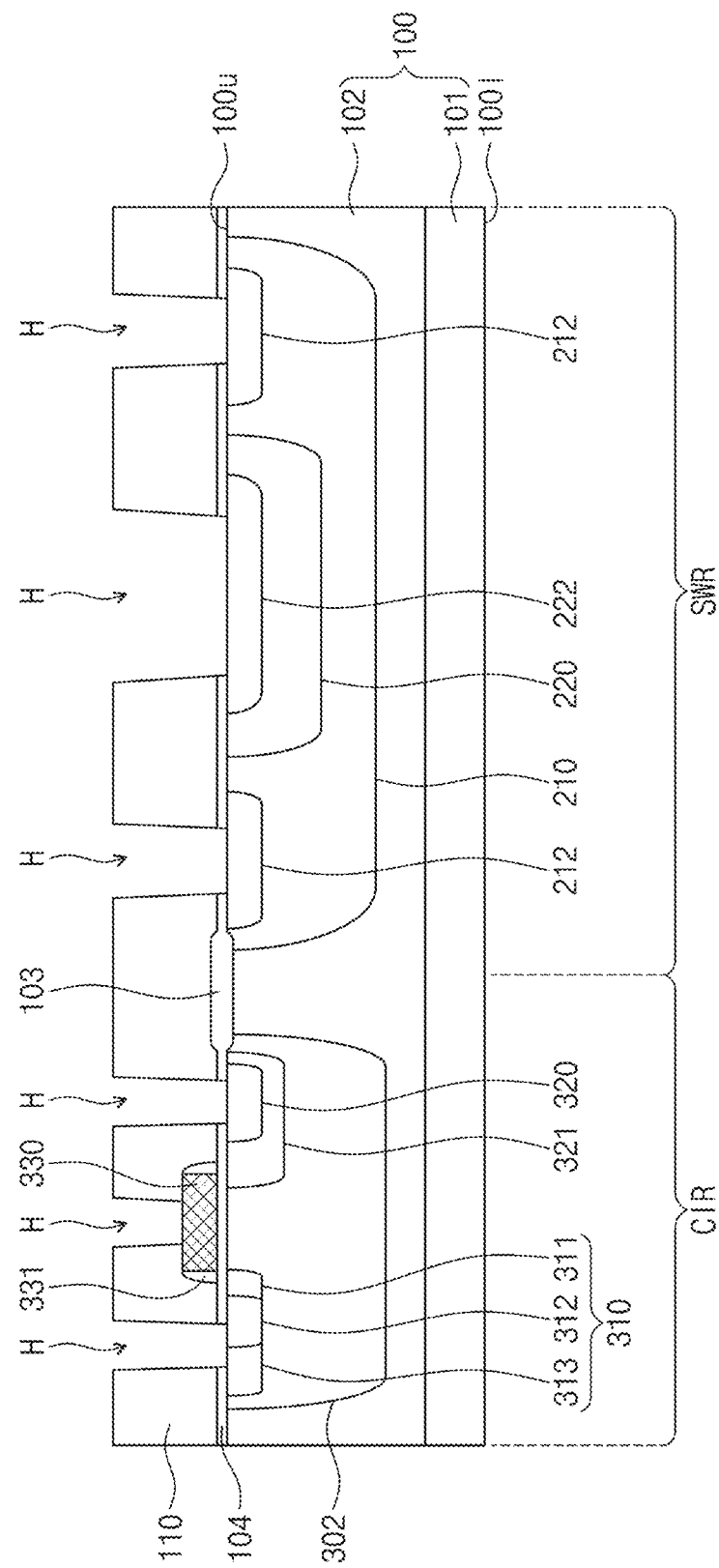
Figure 8P:
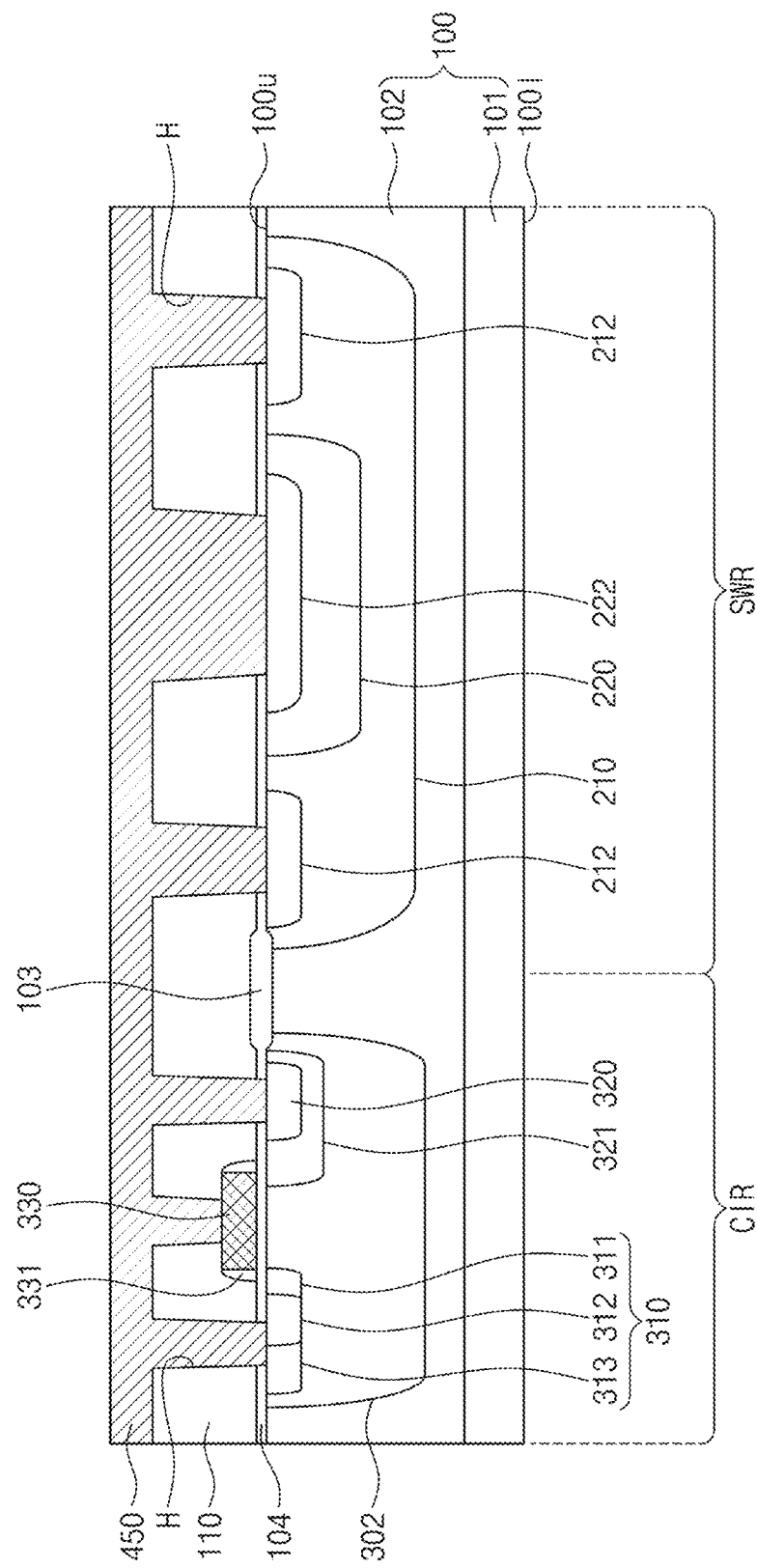

FIG. 8A to FIG. 8P are cross-sectional views for describing methods for manufacturing monolithic metal-insulator transition devices according to embodiments of the inventive concept.

Referring to FIG. 8A, the substrate 100 including the lower layer 101 and the upper layer 102 may be prepared. The lower layer 101 may be formed by doping impurities of the first conductivity type at a high concentration on a semiconductor substrate. The upper layer 102 may be formed by performing an epitaxial growth process on an upper surface of the lower layer 101. The epitaxial growth process may include, for example, a chemical vapor deposition (CVD) process or a molecular beam epitaxy (MBE) process. When forming the upper layer 102, a lower dose of impurities may be injected compared to the lower layer 101. For example, the upper layer 102 may be doped by injecting impurities of the first conductivity type at a dose in the range of $4 \times 10^{13}$ cm-2 to $6 \times 10^{13}$ cm-2. A doping process for the upper layer 102 may be performed in-situ.

A buffer insulation film BP may be formed on the upper surface 100u of the substrate 100. The buffer insulation film BP may be formed using a wet oxidation process or a dry oxidation process. The buffer insulation film BP may cover the entire upper surface 100u of the substrate 100. The thickness of the buffer insulation film BP may have a value in the range of 100 Å to 600 Å. A first mask pattern MP1 having a first opening OP1 which exposes a portion of an upper surface of the buffer insulation film BP may be formed on the buffer insulation film BP. The first mask pattern MP1 may include, for example, a photoresist.

An ion injection process may be performed on the first mask pattern MP1 to inject first impurity ions imp1 having the second conductivity type to the upper portion of the substrate 100. The first impurity ions imp1 may be injected at a dose of $1 \times 10^{12}$ cm$^{-3}$ to $1 \times 10^{14}$ cm$^{-2}$. The first mask pattern MP1 may be removed after the ion injection process.

Referring to FIG. 8B, a heat treatment process may be performed on the substrate 100 to form a channel well region 302. The channel well region 302 may be formed by diffusion of the first impurity ions imp1 described with reference to FIG. 8A. The heat treatment process may be performed in the temperature range of 950° C. to 1250° C. The heat treatment process may be performed in a nitrogen atmosphere.

Referring to FIG. 8C, a second mask pattern MP2 having a second opening OP2 may be formed on the buffer insulation film BP. The second opening OP2 may be positioned on the channel well region 302. An ion injection process may be performed to inject second impurity ions imp2 to an upper portion of the channel well region 302. The second impurity ions imp2 may be injected at a dose of $1 \times 10^{12}$ cm-2 to $1 \times 10^{14}$ cm$^{-2}$. The second impurity ions imp2 may have the first conductivity type. That is, the second impurity ions imp2 may have a different conductivity type from impurities in the channel well region 302. After the ion injection process, the second mask pattern MP2 may be removed.

Referring to FIG. 8D, a third mask pattern MP3 having a third opening OP3 may be formed on the buffer insulation film BP. The third opening OP3 may have a larger width than the first opening OP1 described with reference to FIG. 8A. An ion injection process may be performed to inject third impurity ions imp3 to the upper portion of the substrate 100. The third impurity ions imp3 may have the second conductivity type. The third impurity ions imp3 may have a higher dose than the second impurity ions imp2. The third impurity ions imp3 may be injected at a dose of $5 \times 10^{12}$ cm$^{-2}$ to $5 \times 10^{14}$ cm$^{-2}$. After the ion injection process, the third mask pattern MP3 may be removed.

Referring to FIG. 8D and FIG. 8E, a heat treatment process may be performed on the substrate 100 to form the extension region 321 and the control well region 210. The extension region 321 and the control well region 210 may be simultaneously formed through one heat treatment process. The extension region 321 may be formed by diffusion of the second impurity ions imp2, and the control well region 210 may be formed by diffusion of the third impurity ions imp3. The heat treatment process may be performed in the temperature range of 900° C. to 1200° C. The heat treatment process may be performed in a nitrogen atmosphere.

After exposing the upper surface 100u of the substrate 100, a first buffer insulation film BP1 and a second buffer insulation film BP2 may be formed on the upper surface 100u of the substrate 100. The first buffer insulation film BP1 may include, for example, a silicon oxide. The second buffer insulation film BP2 may include, for example, a silicon nitride. The first buffer insulation film BP1 may have a thickness in the range of 100 Å to 600 Å. The second buffer insulation film BP2 may be thicker than the first buffer insulation film BP1. The second buffer insulation film BP2 may have a thickness in the range of 1000 Å to 2000 Å.

Referring to FIG. 8F, a fourth mask pattern MP4 having a fourth opening OP4 may be formed on the second buffer insulation film BP2. The fourth opening OP4 may be positioned on a space between the channel well region 302 and the control well region 210. An etching process using the fourth mask pattern MP4 may be performed to partially expose an upper surface of the first buffer insulation film BP1. After the etching process, the fourth mask pattern MP4 may be removed.

Referring to FIG. 8G A wet oxidation process may be performed on the first buffer insulation film BP1 to form the field insulation film 103 having a thickness thicker than that of the first buffer insulation film BP1. The wet oxidation process may include, for example, pyrogenic wet oxidation. The field insulation film 103 may have a thickness in the range of 3000 Å to 8000 Å. After the wet oxidation process, the second buffer insulation film BP2 may be removed.

Referring to FIG. 8H, a fifth mask pattern MP5 having a fifth opening OP5 may be formed on the first buffer insulation film BP1. The fifth opening OP5 may be positioned on the control well region 210. An ion injection process may be performed to inject fourth impurity ions imp4 into the control well region 210. The fourth impurity ions imp4 may have the first conductivity type. The fourth impurity ions imp4 may be injected at a dose of $5 \times 10^{13}$ cm$^{-2}$ to $7 \times 10^{14}$ cm$^2$. After the ion injection process, the fifth mask pattern MP5 may be removed.

Referring to FIG. 8H and FIG. 8H, a heat treatment process may be performed on the substrate 100 to form the inlet well region 220. The heat treatment process may be performed in the temperature range of 900° C. to 1100° C. The heat treatment process may be performed in a nitrogen atmosphere.

The first buffer insulation film BP1 may be removed, and the upper insulation film 104 covering the upper surface 100u of the substrate 100 may be formed. The upper insulation film 104 may be connected to the field insulation film 103. The upper insulation film 104 may have a thickness thinner than that of the field insulation film 103. The upper insulation film 104 may have a thickness in the range of 100 Å to 1000 Å.

The gate electrode 330 may be formed on the channel well region 302. The gate electrode 330 may partially overlap the extension region 321. Forming the gate electrode 330 may include forming a polysilicon layer on the upper surface 100u of the substrate 100 and patterning the polysilicon layer. The polysilicon layer may be deposited using a low pressure chemical vapor deposition (LPCVD) method. The polysilicon layer may be doped by performing heat treatment in a POCl3 atmosphere.

Referring to FIG. 8I, a sixth mask pattern MP6 having sixth openings OP6 may be formed on the upper insulation film 104. The sixth openings OP6 may be positioned on each of the channel well region 302, the extension region 321, and the inlet well region 220. The sixth opening OP6 on the channel well region 302 may partially overlap the gate electrode 330. An ion injection process may be performed to inject fifth impurity ions imp5 into the channel well region 302, the extension region 321, and the inlet well region 220. The fifth impurity ions imp5 may have the first conductivity type. The fifth impurity ions imp5 may be injected at a dose of $5 \times 10^{12}$ cm$^{-3}$ to $1 \times 10^{14}$ cm$^{-2}$. After the ion injection process, the sixth mask pattern MP6 may be removed.

Referring to FIG. 8K, a heat treatment process may be performed on the substrate 100 to form preliminary impurity regions 315. The heat treatment process may be performed in the temperature range of 800° C. to 1050° C. The heat treatment process may be performed in a nitrogen atmosphere.

The gate spacer 331 may be formed on sidewalls of the gate electrode 330. Forming the gate spacer 331 may include forming an insulation film on the entire surface of the substrate 100 and isotropically etching the insulation film to leave a portion of the insulation film on the sidewalls of the gate electrode 330.

Referring to FIG. 8L, a seventh mask pattern MP7 having seventh openings OP7 may be formed on the substrate 100. The seventh openings OP7 may be positioned on the preliminary impurity region 315. An ion injection process may be performed to inject sixth impurity ions imp6 into the preliminary impurity region 315. At this time, a portion of the preliminary impurity region 315 may be covered by the gate spacer 331. The sixth impurity ions imp6 may have the first conductivity type. The sixth impurity ions imp6 may be injected at a higher dose than the fifth impurity ions imp5. For example, the sixth impurity ions imp6 may be injected at a dose of $1\times10^{15}$ cm$^{-2}$ to $9\times10^{15}$ cm$^{-2}$. After the ion injection process, the seventh mask pattern MP7 may be removed.

Referring to FIG. 8L and FIG. 8M, a heat treatment process may be performed on the substrate 100 to form the second impurity region 312, the second source/drain region 320, and the inlet contact region 222. The heat treatment process may be performed in the temperature range of 800° C. to 1° C. The heat treatment process may be performed in a nitrogen atmosphere. The second impurity region 312, the second source/drain region 320, and the inlet contact region 222 may be formed by diffusion of the sixth impurity ions imp6 injected into the preliminary impurity region 315. The second impurity region 312, the second source/drain region 320, and the inlet contact region 222 may have an increased impurity concentration in accordance with additional diffusion of the sixth impurity ions imp6. The first impurity region 311 may be formed from the preliminary impurity region 315 covered by the gate spacer 331.

Thereafter, an eighth mask pattern MP8 having eighth openings OP8 may be formed on the substrate 100. The eighth openings OP8 may be positioned on each of the channel well region 302 and the control well region 210. An ion injection process may be performed to inject seventh impurity ions imp7 into the channel well region 302 and the control well region 210. The seventh impurity ions imp7 may have the second conductivity type. The seventh impurity ions imp7 may be injected at a dose of $1\times10^{15}$ cm$^{-2}$ to $9\times10^{15}$ cm$^{-2}$. After the ion injection process, the eighth mask pattern MP8 may be removed.

Referring to FIG. 8N, a heat treatment process may be performed on the substrate 100 to form the third impurity region 313 and the control contact regions 212. The heat treatment process may be performed in the temperature range of 800° C. to 1050° C. The heat treatment process may be performed in a nitrogen atmosphere. The first impurity region 311, the second impurity region 312, and the third impurity region 313 may constitute the first source/drain region 310.

Referring to FIG. 8O, the interlayer insulation film 110 may be formed on the entire surface of the substrate 100. The interlayer insulation film 110 may be formed using a low pressure chemical vapor deposition (LPCVD) process. The interlayer insulation film 110 may cover the gate electrode 330 and the gate spacer 331. The interlayer insulation film 110 may have a thickness in the range of 3000 Å to 10000 Å.

Thereafter, holes H passing through the interlayer insulation film 110 may be formed. The holes H may expose upper surfaces of the first and second source/drain regions 310 and 320, the control contact regions 212, the inlet contact region 222, and the gate electrode 330. A hole H exposing the inlet contact region 222 may be formed to have a larger width than the other holes H.

Referring to FIG. 8P, a metal film 450 filling the holes H may be formed on the interlayer insulation film 110. Forming the metal film 450 may be performed using any one among physical vapor deposition (PVD), chemical vapor deposition (CVD), and atomic layer deposition (ALD). For example, the metal film 450 may be formed using a sputtering process. A planarization process may be performed on an upper surface of the metal film 450.

Referring back to FIG. 3 and FIG. 4, the metal film 450 on an upper surface of the interlayer insulation film 110 may be patterned to form the first wiring 412, the second wiring 414, and the third wiring 420. The first wiring 412, the second wiring 414, and the third wiring 420 may be electrically separated from each other.

The lower electrode 140 may be formed on the lower surface 100l of the substrate 100. The lower electrode 140 may be formed on the entire lower surface 100l of the substrate 100 using a physical vapor deposition (PVD) process. The physical vapor deposition (PVD) process may include, for example, a sputtering process.

According to embodiments of the present invention, a monolithic metal-insulator transition device which has excellent electrical properties and is easy-to-manufacture may be provided.

Those of ordinary skill in the art to which the present invention pertains will understand that the present invention may be embodied in other specific forms without changing the technical spirit or essential features thereof. It is therefore to be understood that the above-described embodiments are illustrative in all aspects and not restrictive.

What is claimed is:

1. A monolithic metal-insulator transition device comprising:
   a lower electrode;
   a substrate provided on the lower electrode, having a first impurity, a driving region and a switching region in contact with the driving region;
   a channel well region provided within the substrate in the driving region and having a second impurity;
   a gate electrode on a center of the channel well region;
   a first source/drain region provided on one side of the channel well region and having the first impurity;
   a second source/drain region provided on another side of the channel well region, having the first impurity, and being deeper than the first source/drain region;
   a control well region provided within the substrate in the switching region and having a depth different from that of the second impurity and the channel well region;
   an inlet well region provided within the center of the control well region;
   an inlet contact area provided within a center of the inlet well region and having a first depth;
   a control contact area within an edge of the control well area outside both sides of the inlet well region;
   a first contact provided on the first source/drain region;
   a second contact provided on the second source/drain region;
   a gate contact provided on the gate electrode;
   an inlet contact provided on the inlet contact area;
   a control contact provided on the control contact area;
   a first line connecting the first contact to the control contact;
   a second line connecting the second contact to the inlet contact; and
   a third line connected to the gate contact,
   wherein the first source/drain region comprises:
   a first lower concentration impurity region having the first impurity, the first depth, a first width, and a first edge aligned with one edge of the gate electrode; and
   a first higher concentration impurity region provided in the first lower concentration impurity region and having the first depth and a second width narrower than the first width, the first higher concentration impurity region being disposed at a first distance from the first edge, and having a concentration higher than that of the first impurity of the first lower concentration impurity region,
   wherein the second source/drain region comprises:

a second lower concentration impurity region having a second depth deeper than the first depth, a second width wider than the first width, and a second edge partially overlapping another edge of the gate electrode; and a second higher concentration impurity region provided in the second lower concentration impurity region and disposed at a second distance longer than the first distance from the second edge, the second higher concentration impurity region having the first depth, the second width, and a concentration higher than that of the second lower concentration impurity region of the first impurity.

2. The monolithic metal-insulator transition device of claim 1, wherein a lower end of the control inlet contact has a larger width than a lower end of the source/drain first contact.

3. The monolithic metal-insulator transition device of claim 1, wherein a lower end of the inlet contact has a larger width than the gate electrode.

* * * * *